United States Patent
Hirano et al.

(10) Patent No.: US 9,812,611 B2
(45) Date of Patent: Nov. 7, 2017

(54) NITRIDE SEMICONDUCTOR ULTRAVIOLET LIGHT-EMITTING ELEMENT AND NITRIDE SEMICONDUCTOR ULTRAVIOLET LIGHT-EMITTING DEVICE

(71) Applicant: Soko Kagaku Co., Ltd., Ishikawa (JP)

(72) Inventors: Akira Hirano, Aichi (JP); Masamichi Ippommatsu, Aichi (JP)

(73) Assignee: Soko Kagaku Co., Ltd., Ishikawa (JP)

( * ) Notice: Subject to any disclaimer, the term of this patent is extended or adjusted under 35 U.S.C. 154(b) by 0 days.

(21) Appl. No.: 15/027,106

(22) PCT Filed: Apr. 3, 2015

(86) PCT No.: PCT/JP2015/060588
§ 371 (c)(1),
(2) Date: Apr. 4, 2016

(87) PCT Pub. No.: WO2016/157518
PCT Pub. Date: Oct. 6, 2016

(65) Prior Publication Data
US 2017/0263817 A1  Sep. 14, 2017

(51) Int. Cl.
*H01L 33/24* (2010.01)
*H01L 33/44* (2010.01)
(Continued)

(52) U.S. Cl.
CPC ............ *H01L 33/24* (2013.01); *H01L 33/32* (2013.01); *H01L 33/387* (2013.01); *H01L 33/44* (2013.01);
(Continued)

(58) Field of Classification Search
None
See application file for complete search history.

(56) References Cited

U.S. PATENT DOCUMENTS 9,537,073 B2 *  1/2017  Shih ..................... H01L 33/62
2012/0113328 A1   5/2012  Takeshima et al.
(Continued)

FOREIGN PATENT DOCUMENTS

JP   2008153362 A   7/2008
JP   2009048915 A   3/2009
(Continued)

OTHER PUBLICATIONS

Sumiya, et al., "AlGaN-Based Deep Ultraviolet Light-Emitting Diodes Grown on Epitaxial AlN/Sapphire Templates," Japanese Journal of Applied Physics, vol. 47, No. 1, (2008), pp. 43-46.
(Continued)

*Primary Examiner* — Joseph Schoenholtz
(74) *Attorney, Agent, or Firm* — Haynes Beffel & Wolfeld LLP

(57) ABSTRACT

There is provided a nitride semiconductor ultraviolet light-emitting element capable of efficiently releasing a waste heat generated in an ultraviolet light emitting operation. The nitride semiconductor ultraviolet light-emitting element includes a semiconductor laminated portion 11 having an n-type AlGaN layer 6, an active layer 7 of an AlGaN layer, and p-type AlGaN layers 9 and 10; an n electrode 13; a p electrode 12; a protective insulating film 14, and a first plated electrode 15 formed by a wet plating method and composed of copper or alloy containing copper as a main component. The semiconductor laminated portion 11 is formed in a first region R1, and the p electrode is formed on the portion 11. An upper surface of the n-type AlGaN-based semiconductor layer 6 is exposed in a second region, and the n electrode 13 is formed on the upper surface. The protective
(Continued)

insulating film 14 has openings for exposing at least one part of the n electrode 13 and at least one part of the p electrode 12. The first plated electrode 15 is spaced apart from the exposed surface of the n electrode 13 and covers a whole upper surface and a whole outer side surface of the first region R1, and a part of the second region R2 which is in contact with the first region R1.

17 Claims, 16 Drawing Sheets

(51) Int. Cl.
*H01L 33/32* (2010.01)
*H01L 33/46* (2010.01)
*H01L 33/38* (2010.01)

(52) U.S. Cl.
CPC ...... *H01L 33/46* (2013.01); *H01L 2933/0016* (2013.01)

(56) References Cited

U.S. PATENT DOCUMENTS

2012/0161196 A1* 6/2012 Lowenthal ............ H01L 25/048
257/100
2015/0243856 A1 8/2015 Yamada et al.

FOREIGN PATENT DOCUMENTS

| JP | 2011029634 A | 2/2011 |
| JP | 2011228380 A | 11/2011 |
| JP | 2012169332 A | 9/2012 |
| WO | 2012107973 A1 | 8/2012 |
| WO | 2014178288 A1 | 11/2014 |

OTHER PUBLICATIONS

Nagamatsu, "High-efficiency AlGaN-based UV light-emitting diode on laterally overgrown AlN," Journal of Crystal Growth, 310, (2008), pp. 2326-2329.

* cited by examiner

NITRIDE SEMICONDUCTOR ULTRAVIOLET LIGHT-EMITTING ELEMENT AND NITRIDE SEMICONDUCTOR ULTRAVIOLET LIGHT-EMITTING DEVICE

TECHNICAL FIELD

The present invention relates to a nitride semiconductor ultraviolet light-emitting element, and a nitride semiconductor ultraviolet light-emitting device having the nitride semiconductor ultraviolet light-emitting element, and more particularly, to a technique to improve an electrode structure of a nitride semiconductor ultraviolet light-emitting element to be used for flip-chip mounting, in which a light having a center emission wavelength of about 355 nm or less is extracted from a substrate side.

BACKGROUND ART

Conventionally, an AlGaN-based nitride semiconductor includes a light-emitting element or a light-receiving element having a multi-layer structure formed on a base of a GaN layer or an AlGaN layer having a relatively low AlN mole fraction (also called an AlN mixed crystal ratio or Al composition ratio) (refer to Non-patent Document 1 and Non-patent Document 2, for example). FIG. 16 shows a conventional crystal layer structure of an AlGaN-based light-emitting diode. The light-emitting diode shown in FIG. 16 has a laminated structure in which a base layer 102 including an AlN layer is formed on a sapphire substrate 101, and on the base layer 102, an n-type clad layer 103 composed of n-type AlGaN, an AlGaN/GaN multiple quantum well active layer 104, an electron block layer 105 composed of p-type AlGaN, a p-type clad layer 106 composed of p-type AlGaN, and a contact layer 107 composed of p-type GaN are sequentially laminated. The multiple quantum well active layer 104 has a structure having multiple-layer structures each having a GaN well layer sandwiched between AlGaN barrier layers. After crystal growth, the multiple quantum well active layer 104, the electron block layer 105, the p-type clad layer 106, and the p-type contact layer 107 are partially etched away until a part of a surface of the n-type clad layer 103 is exposed. After that, a p electrode 108 composed of Ni/Au is formed on a surface of the p-type contact layer 107, and an n electrode 109 composed of Ti/Al/Ti/Au is formed on the exposed surface of the n-type clad layer 103. By changing an AlN mole fraction and a thickness of an AlGaN well layer in place of the GaN well layer, a light emission wavelength is reduced, or by adding In, the light emission wavelength is increased, so that the light-emitting diode having an ultraviolet light region from a wavelength of 200 nm to 400 nm can be manufactured.

PRIOR ART DOCUMENTS

Patent Document

Patent Document 1: WO 2014/178288

Non-Patent Documents

Non-patent Document 1: Kentaro Nagamatsu, et al., "High-efficiency AlGaN-based UV light-emitting diode on laterally overgrown AlN", Journal of Crystal Growth, 2008, 310, pp. 2326-2329

Non-patent Document 2: Shigeaki Sumiya, et al., "AlGaN-Based Deep Ultraviolet Light-Emitting Diodes Grown on Epitaxial AlN/Sapphire Templates", Japanese Journal of Applied Physics, Vol. 47, No. 1, 2008, pp. 43-46

SUMMARY OF THE INVENTION

Problems to be Solved by the Invention

Light emission efficiency of an ultraviolet light-emitting element of an AlGaN-based semiconductor is about a few tenths to a half of that of a blue light-emitting element in an InGaN-based semiconductor.

For example, in a case where a light-emitting element is formed by growing an AlGaN-based semiconductor on a sapphire substrate, the AlN mole fraction of the AlGaN-based semiconductor needs to be increased to increase bandgap energy as a light emission wavelength is decreased. Accordingly, a difference in lattice constant is increased between the AlGaN-based semiconductor and the sapphire substrate. In the AlGaN-based semiconductor ultraviolet light-emitting element, a lattice mismatch is increased as the light emission wavelength is decreased, so that there is a problem that a density of threading dislocation is increased in an AlGaN-based semiconductor thin film. The high density of the threading dislocation causes a reduction in internal quantum efficiency of the AlGaN-based semiconductor light-emitting element. On the other hand, the blue light-emitting element does not require high bandgap energy unlike the ultraviolet light-emitting element, so that the internal quantum efficiency is not considerably reduced due to the lattice mismatch, and the internal quantum efficiency of about 90% can be attained.

Furthermore, the nitride semiconductor has a wurtzite-type crystal structure, and is asymmetric in a c-axis direction, so that the nitride semiconductor has high polarity and an electric field is generated in the c-axis direction due to spontaneous polarization. Furthermore, the nitride semiconductor is high in piezoelectric effect, so that in a case where the AlGaN-based semiconductor is grown on the sapphire substrate in the c-axis direction, for example, an electric field due to piezoelectric polarization (piezoelectric field) is generated in a direction normal to an interface. Here, in a case where the light-emitting diode is manufactured by growing the crystal in the c-axis direction to have the above-described laminated structure, an electric field generated due to a difference in spontaneous polarization between both hetero interfaces of the well layer and the barrier layers is combined with a piezoelectric field due to compression strain along the c-axis direction, whereby an internal electric field is generated in the well layer in the quantum well active layer. Thus, due to this internal electric field, in the AlGaN-based semiconductor, a potential in each of a valence band and a conduction band falls from the n-type clad layer toward the p-type clad layer in the well layer in the active layer. As a result, in the well layer, the electrons are dominantly distributed on the side of the p-type clad layer, and the holes are dominantly distributed on the side of the n-type clad layer. Accordingly, the electrons and holes are spatially isolated, the recombination is hindered, and then the internal quantum efficiency decreases.

When indium (In) is added to the AlGaN-based semiconductor in the well layer by about a few percents, it has been found that due to an effect of naturally generating composition fluctuation (In composition modulation effect) in which the In composition is non-uniformly distributed on the order of nanometers in a crystal growth process, the light emission efficiency can be prevented from being reduced due to the internal electric field generated in the well layer in the quantum well active layer. That is, the ultraviolet light-emitting diode has a reduced light emission efficiency in general, compared with the blue light-emitting diode of the InGaN-based semiconductor containing In in large amounts in the nitride semiconductor in the well layer.

As described above, the light emission efficiency of the nitride semiconductor ultraviolet light-emitting element is reduced to about a few tenths to a half of that of the blue light-emitting element, and a forward voltage applied to between the electrodes is about two times higher than that of the blue light-emitting element. A power which has not contributed to the light emission in an applied power is consumed as a waste heat, so that a heat releasing process to efficiently release the waste heat to the outside of the element is needed in order to prevent a junction temperature from rising due to the waste heat. The nitride semiconductor ultraviolet light-emitting element is greatly required to perform the heat releasing process, compared with the blue light-emitting element, and especially, this is more conspicuously required in a deep ultraviolet region having a light emission wavelength of 300 nm or less.

The nitride semiconductor ultraviolet light-emitting element is generally mounted by flip-chip mounting (refer to FIG. 4 in Patent Document 1, for example). In the flip-chip mounting, the light emitted from the active layer passes through the AlGaN-based nitride semiconductor and the sapphire substrate having higher bandgap energy than the active layer and is extracted outside the element. Thus, in the flip-chip mounting, the sapphire substrate faces upward, and each of p-side and n-side electrode surfaces formed on an upper surface of a chip face downward, so that the electrode surface of the chip is electrically and physically connected to an electrode pad on a package serving as a submount through metal bumps formed on the electrode surfaces.

As described above, in the flip-chip mounting, the light emitted from the active layer passes through the AlGaN-based nitride semiconductor and the sapphire substrate having the higher bandgap energy than the active layer and is extracted outside the element, so that the light is not absorbed by the layer having the high bandgap energy. As a result, light extraction efficiency is high, and a heat releasing effect is high in the flip-chip mounting, compared with the conventional face-up mounting with wire bonding because the electrode surface and the electrode pad on the package are connected through a thick and short metal bump having low heat resistance, instead of a thin and long wire.

However, a plurality of the metal bumps each having a spherical shape in general are dispersedly disposed along an electrode shape, so that the metal bumps are difficult to uniformly form on the whole electrode surface, which is not ideal in view of heat conduction, and a further improvement is needed.

When the heat releasing process is not sufficiently performed on the nitride semiconductor ultraviolet light-emitting element, especially a deep-ultraviolet light-emitting element having a short light emission wavelength, the junction temperature abnormally rises, which could cause a reduction in light emission output, and even could cause a reduction in reliability or lifetime of the element. Thus, the light-emitting element is required to be able to release a heat more efficiently.

The present invention has been made in view of the above problems, and its object is to provide a nitride semiconductor ultraviolet light-emitting element capable of more efficiently releasing a waste heat generated due to light emission.

Means for Solving the Problem

In order to achieve the above object, the present invention provides, as a first feature, a nitride semiconductor ultraviolet light-emitting element comprises a semiconductor laminated portion including, in a laminated manner, a first semiconductor layer having one or more n-type AlGaN-based semiconductor layers, an active layer having one or more AlGaN-based semiconductor layers having an AlN mole fraction of zero or more, and a second semiconductor layer having one or more p-type AlGaN-based semiconductor layers; an n electrode including one or more metal layers; a p electrode including one or more metal layers; a protective insulating film; and a first plated electrode which is in contact with an exposed surface of the p electrode which is not covered with the protective insulating film, wherein, referring to a region that the one nitride semiconductor ultraviolet light-emitting element is formed in a plane parallel to a surface of the semiconductor laminated portion as an element region, the semiconductor laminated portion includes the active layer and the second semiconductor layer laminated on the first semiconductor layer in a first region which is a part of the element region, and does not include the active layer and the second semiconductor layer laminated on the first semiconductor layer in a second region in the element region other than the first region, the first region has a recess surrounding the second region from three directions in planarly-viewed shape, the second region continuously has a recessed region surrounded by the recess of the first region, and a periphery region other than the recessed region, the n electrode is formed on the first semiconductor layer in the second region and covers the recessed region and the periphery region, the p electrode is formed on an uppermost surface of the second semiconductor layer, the protective insulating film covers at least a whole outer side surface of the semiconductor laminated portion in the first region, an upper surface of the first semiconductor layer provided between the first region and the n electrode, and an upper surface and a side surface of an outer edge portion of the n electrode including a portion at least facing the first region, and does not cover and exposes at least one part of a surface of the n electrode and at least one part of a surface of the p electrode, and the first plated electrode is composed of copper or alloy containing copper as a main component, formed by wet plating method, spaced apart from the exposed surface of the n electrode which is not covered with the protective insulating film, and covers a whole upper surface of the first region including the exposed surface of the p electrode, the whole outer side surface of the first region covered with the protective insulating film, and a boundary region which is a part of the second region and which is in contact with the first region.

In the present invention, the AlGaN-based semiconductor is based on a ternary (or binary) compound expressed by a general formula of $Al_xGa_{1-x}N$ (x represents AlN mole fraction, $0 \leq x \leq 1$), is a group-III nitride semiconductor having bandgap energy equal to or higher than bandgap energy (about 3.4 eV) of GaN (x=0), and includes a case where a slight amount of In is contained as long as the condition regarding the bandgap energy is satisfied.

According to the nitride semiconductor ultraviolet light-emitting element with the first feature, when a current flows from the p electrode to the n electrode through the second semiconductor layer, the active layer, and the first semiconductor layer, the ultraviolet light is emitted from the active layer, and a power which has not contributed to the light emission in the active layer is converted to a heat as a waste heat. A waste heat is also generated due to parasitic resistance of the first semiconductor layer and the second semiconductor layer. Therefore, the waste heat is mostly generated from the semiconductor laminated portion in the first region. Here, the n-type AlGaN-based semiconductor layer serves as the n-type clad layer, so that the n-type AlGaN-based semiconductor layer needs to have higher AlN mole fraction than the active layer, such as about 20% or more. However, when the n-type AlGaN-based semiconductor layer has the high AlN mole fraction, its specific resistance is higher than n-type GaN. Accordingly, it is necessary to prevent a voltage drop due to the parasitic resistance in the first semiconductor layer, by shortening a distance between the n electrode, and an interface between the n-type AlGaN-based semiconductor layer and the active layer. Thus, according to the nitride semiconductor ultraviolet light-emitting element with the first feature, the first region is formed into a planarly-viewed shape having the recess surrounding the second region from the three direction, such as a planarly-viewed comb-like shape, and the n electrode is formed on the first semiconductor layer and covers the recessed region and the periphery region in the second region, so that the distance between the n electrode and the above interface can be short to prevent the voltage drop due to the parasitic resistance. Furthermore, since the first region has the planarly-viewed shape having the recess, a circumferential length of the first region can be large. That is, an area of the outer side surface of the semiconductor laminated portion can be large.

According to the nitride semiconductor ultraviolet light-emitting element with the first feature, the first plated electrode can have a large contact area with the whole upper surface of the first region including the exposed surface of the p electrode, the whole outer side surface of the first region covered with the protective insulating film, and the boundary region which is a part of the second region and is in contact with the first region, which are covered with the first plated electrode (hereinafter, the surfaces covered with the first plated electrode are collectively referred to as the "covered surface" for descriptive purposes). In addition, since the first region has the planarly-viewed shape having the recess, a distance can be short between a position in which the waste heat is generated in the semiconductor laminated portion, and the covered surface. As a result, the waste heat can be transmitted to the first plated electrode through the covered surface with high efficiency, and the heat releasing effect of the light-emitting element can be considerably improved.

Furthermore, since the exposed surface of the n electrode which is not covered with the protective insulating film is spaced apart from the first region, the spaced distance between the first plated electrode and the exposed surface of the n electrode can be longer than a spaced distance between the n electrode and the p electrode provided in a case where the first plated electrode is not formed, so that after the flip-chip mounting, an electric field being applied to the sealing resin filled between the first plated electrode and the n electrode can be reduced. Thus, a short-circuit phenomenon between the electrodes, caused by metal diffusion (metal migration) due to a photochemical reaction between the sealing resin and the ultraviolet light, and due to the above electric field can be considerably prevented from being generated even when there is a concern about the short-circuit phenomenon depending on a composition of the sealing resin. Furthermore, the short-circuit phenomenon between the electrodes is described in detail in Patent Document 1.

Patent Document 1 describes that in a case where a bonding amorphous fluorine resin having a reactive functional group whose terminal functional group has a metal-bonding property is used for a part to cover a pad electrode of an ultraviolet light-emitting element of a nitride semiconductor, when the ultraviolet light emitting operation is performed by applying a forward voltage to between metal electrode wirings connected to a p electrode and an n electrode of the ultraviolet light-emitting element, the ultraviolet light-emitting element is deteriorated in electric characteristics. According to Patent Document 1, in the case where the amorphous fluorine resin is the bonding amorphous fluorine resin, in the bonding amorphous fluorine resin irradiated with a high-energy ultraviolet light, its reactive terminal functional group is separated and becomes a radical due to a photochemical reaction, which causes coordinate bonding with a metal composing the pad electrode, so that the metal atom is separated from the pad electrode. Furthermore, when an electric field is applied to the pad electrodes during the light emitting operation, the metal atom causes migration, so that a resistive leak current path is formed, and the short circuit is caused between the p electrode and the n electrode of the ultraviolet light-emitting element.

Furthermore, according to the nitride semiconductor ultraviolet light-emitting element with the first feature, it is preferable that the recessed region of the second region is entirely covered with the first plated electrode through the protective insulating film. Due to the above preferable aspect, the area of the upper surface of the first plated electrode can be considerably larger than the area of the upper surface of the p electrode, and a contact area between the first plated electrode and an electrode pad on a package can be considerably large after the flip-chip mounting, so that the heat releasing effect can be further improved.

Furthermore, according to the nitride semiconductor ultraviolet light-emitting element with the first feature, it is preferable that the first plated electrode is spaced apart from the exposed surface of the n electrode which is not covered with the protective insulating film, by 75 µm or more. Due to the above preferable aspect, the first plated electrode can be formed with high yield without making a contact with the exposed surface of the n electrode.

Furthermore, according to the nitride semiconductor ultraviolet light-emitting element with the first feature, it is preferable that the protective insulating film further covers an upper surface and a side surface around an outer edge portion of the p electrode, and an exposed surface of the uppermost surface of the second semiconductor layer which is not covered with the p electrode. Due to the above preferable aspect, since an alignment margin is provided between an end of the protective insulating film on the p electrode and an outer circumference of the first region, the protective insulating film can surely cover the whole outer side surface of the semiconductor laminated portion in the first region. Thus, the first plated electrode can be prevented from causing the short-circuit among the first semiconductor layer, the active layer, and the second semiconductor in the semiconductor laminated portion and cover the outer side surface of the semiconductor laminated portion in the first region through the protective insulating film.

Furthermore, as a second feature, the nitride semiconductor ultraviolet light-emitting element with the first feature further comprises a second plated electrode formed at least on the exposed surface of the n electrode which is not covered with the protective insulating film, formed by the wet plating method and composed of copper or alloy containing copper as a main component, wherein the first plated electrode and the second plated electrode are spaced apart from each other. Due to the second feature, upper surfaces of the first plated electrode and the second plated electrode can be level with each other, so that at the time of flip-chip mounting, the first plated electrode and the second plated electrode can be connected to the respective electrode pads on the package by the same connecting method such as soldering. Thus, the process of the flip-chip mounting can be simplified. Furthermore, the second plated electrode can be formed in the same process as the first plated electrode.

Furthermore, according to the nitride semiconductor ultraviolet light-emitting element with the second feature, it is preferable that surfaces of the first plated electrode and the second plated electrode are planarized and heights of the surfaces vertical to the surface of the semiconductor laminated portion are level with each other.

Furthermore, according to the nitride semiconductor ultraviolet light-emitting element with the second feature, it is preferable that a spaced distance between the first plated electrode and the second plated electrode is 75 µm or more. Due to the above preferable aspect, the first plated electrode and the second plated electrode can be formed with high yield without coming in contact with each other.

Furthermore, according to the nitride semiconductor ultraviolet light-emitting element with the second feature, it is preferable that a single-layer or multiple-layer plated metal film including gold at least on an uppermost layer is formed on each of the surfaces of the first plated electrode and the second plated electrode. Due to the above preferable aspect, even when it takes a long time before the flip-chip mounting is performed after the first plated electrode and the second plated electrode have been formed, the surfaces of the first plated electrode and the second plated electrode can be prevented from being oxidized. Thus, the first plated electrode and the second plated electrode can be surely connected to the respective electrode pads on the package with a solder or the like. Furthermore, the above aspect is preferable in a case where a gold (Au) bump is formed on the plated metal film.

Furthermore, according to the nitride semiconductor ultraviolet light-emitting element with the first or second feature, it is preferable that an outer periphery of the first plated electrode is entirely located on the n electrode through the protective insulating film. Furthermore, according to the nitride semiconductor ultraviolet light-emitting element with the first or second feature, it is preferable that the first plated electrode is formed and filled in a dent in the recessed region surrounded by the outer side surface of the semiconductor laminated portion in the first region, and an upper surface of the first plated electrode is wholly flat. Due to the above preferable aspect, the area between the first plated electrode and the electrode pad on the package which are connected with the solder or the like can be further largely ensured at the time of the flip-chip mounting. Thus, after the flip-chip mounting, the heat can be more likely to be released through the first plated electrode which is close to the active layer serving as the greatest heat generation source, and the heat releasing effect can be further improved.

Furthermore, according to the nitride semiconductor ultraviolet light-emitting element with the first or second feature, it is preferable that the wet plating method includes an electrolytic plating method, and a power-feeding seed film used in the electrolytic plating method is formed between the protective insulating film and the first plated electrode.

Furthermore, according to the nitride semiconductor ultraviolet light-emitting element with the first or second feature, it is preferable that the protective insulating film includes a transparent insulating film composed of an insulating material which transmits ultraviolet light emitted from the active layer, and an ultraviolet light refractive layer is formed between the protective insulating film and the seed film to reflect the ultraviolet light at a reflectivity higher than an ultraviolet light reflectivity of the seed film.

When the protective insulating film is the transparent insulating film, the ultraviolet light emitted from the active layer of the semiconductor laminated portion partially enters the seed film through the transparent insulating film. In this case, this ultraviolet light is reflected from the seed layer toward the semiconductor laminated portion only at an ultraviolet light reflectivity corresponding to a light emission wavelength of the ultraviolet light, so that the non-reflected ultraviolet light cannot be effectively used. However, by providing the ultraviolet light reflective layer having the higher ultraviolet light reflectivity, between the protective insulating film and the seed film, the ultraviolet light entering toward the seed film can be more effectively used, so that external quantum efficiency of the ultraviolet light-emitting element can be improved.

Furthermore, according to the nitride semiconductor ultraviolet light-emitting element with the first or second feature, it is preferable that the protective insulating film includes a transparent insulating film composed of an insulating material which transmits ultraviolet light emitted from the active layer, and an opaque insulating film is formed at least one part on the protective insulating film between the first plated electrode and the exposed surface of the n electrode, and composed of an insulating material which does not transmit the ultraviolet light emitted from the active layer.

Furthermore, according to the nitride semiconductor ultraviolet light-emitting element with the first or second feature, it is preferable that the protective insulating film includes an opaque insulating film composed of an insulating material which does not transmit the ultraviolet light emitted from the active layer.

In the case where the protective insulating film is the transparent insulating film, when the ultraviolet light is partially reflected at an interface on a back surface side serving as a light extracting side of the semiconductor laminated portion and travels toward the active layer, there is a slight possibility that this ultraviolet light partially enters a part in which the first plated electrode is not formed on the protective insulating film (a gap portion) and is extracted outside the element through the gap portion. This ultraviolet light emitted outside the element through the gap portion enters a sealing resin filled in a gap between the n electrode or the second plated electrode connected with the n electrode, and the first plated electrode at the time of flip-chip mounting. However, by providing the above opaque insulating film, the ultraviolet light is prevented from entering the gap, so that the sealing resin can be prevented from being deteriorated due to the entering of the ultraviolet light.

The present invention provides a nitride semiconductor ultraviolet light-emitting device, as a first aspect, comprising a base including a metal film on a surface of an insulating base material, the metal film having a predetermined planarly-viewed shape and including two or more electrode pads, and the nitride semiconductor ultraviolet light-emitting element in at least one of the first and second features mounted on the base with the first plated electrode facing the electrode pad, wherein the first plated electrode is electrically and physically connected to the opposed electrode pad. That is, the nitride semiconductor ultraviolet light-emitting device with the first feature has the mounted nitride semiconductor ultraviolet light-emitting element with the above feature by flip-chip mounting and provides the same operation and effect as the nitride semiconductor ultraviolet light-emitting element with the above feature.

Furthermore, according to the nitride semiconductor ultraviolet light-emitting device with the first feature, as a second feature, the nitride semiconductor ultraviolet light-emitting element further includes a second plated electrode formed at least on an exposed surface of the n electrode which is not covered with the protective insulating film, formed by the wet plating method, and composed of copper or alloy containing copper as a main component, wherein the first plated electrode and the second plated electrode are spaced apart from each other, and wherein the first plated electrode is electrically and physically connected to the one electrode pad, and the second plated electrode is electrically and physically connected to the other electrode pad, in the one nitride semiconductor ultraviolet light-emitting element. According to the second feature, the upper surfaces of the first plated electrode and the second plated electrode can be level with each other, so that at the time of flip-chip mounting, the first plated electrode and the second plated electrode can be connected to the respective electrode pads on the base by the same connecting method such as soldering. Thus, the process of the flip-chip mounting can be simplified.

Furthermore, according to the nitride semiconductor ultraviolet light-emitting device with the second feature, it is preferable that the base includes a plurality of couples of electrode pads which each include a first electrode pad and at least one second electrode pad electrically separated from the first electrode pad, a plurality of the nitride semiconductor ultraviolet light-emitting elements are mounted on the base, and the first plated electrode in the one nitride semiconductor ultraviolet light-emitting element is electrically and physically connected to the first electrode pad in the one couple of electrode pads, and the second plated electrode in the one nitride semiconductor ultraviolet light-emitting element is electrically and physically connected to the second electrode pad in the one couple of electrode pads. According to the preferable aspect, each of the nitride semiconductor ultraviolet light-emitting elements mounted on the base includes the first plated electrode and the second plated electrode, and upper surfaces of the electrodes can be level with each other, so that at the time of flip-chip mounting, the first plated electrode and the second plated electrode in each of the nitride semiconductor ultraviolet light-emitting elements can be connected to the respective electrode pads on the package by the same connecting method such as soldering. Thus, the process of mounting a plurality chips by the flip-chip mounting can be simplified.

Effect of the Invention

According to the nitride semiconductor ultraviolet light-emitting element and device with the above features, the waste heat due to the light emission can be efficiently released, and the light emission output is improved and the reliability and the lifetime can be improved in each of the nitride semiconductor ultraviolet light-emitting element and device.

DESCRIPTION OF EMBODIMENT

Figure 1:
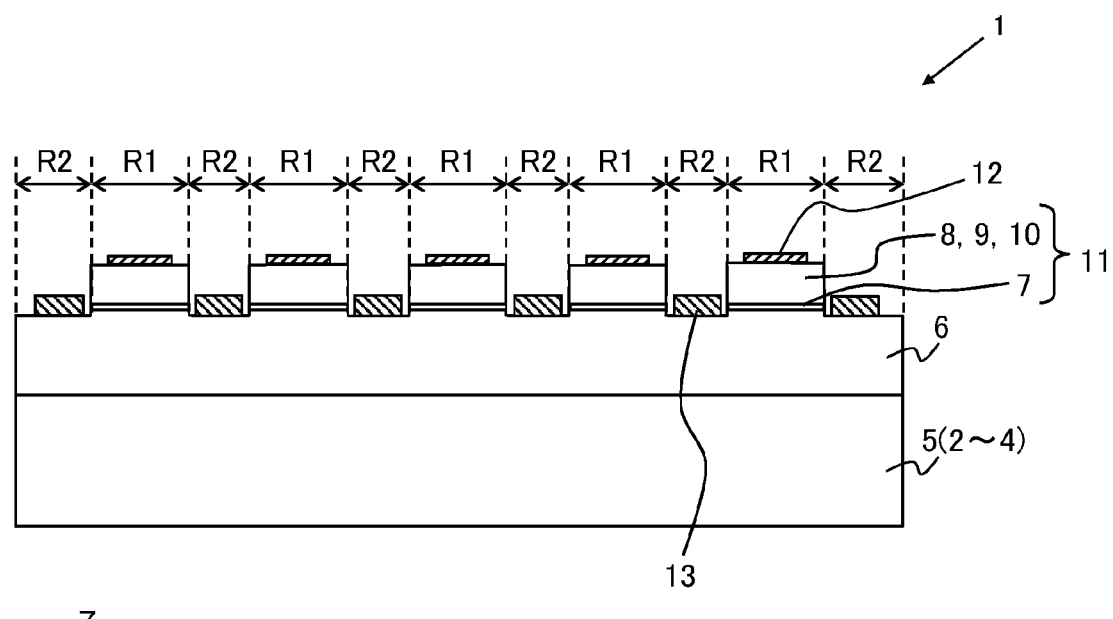
FIG. 1 is a cross-sectional view schematically showing one example of an element structure taken along a line A-A' in first to fifth embodiments of a nitride semiconductor ultraviolet light-emitting element in the present invention, in which a protective insulating film, and first and second plated electrodes are not formed yet.
Figure 1:
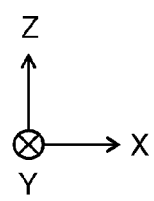

A nitride semiconductor ultraviolet light-emitting element in each of embodiments in the present invention (hereinafter, referred to as the "present light-emitting element" occasionally) will be described with reference to the drawings. In addition, for easy understanding of the description, an essential part is emphasized to schematically illustrate invention contents in the drawings used in the following description, so that a dimensional ratio of each component does not correspond to a dimensional ratio of an actual element and a component actually to be used. Hereinafter, the description will be given supposing a case where the present light-emitting element is a light-emitting diode.

First Embodiment

Figure 2:
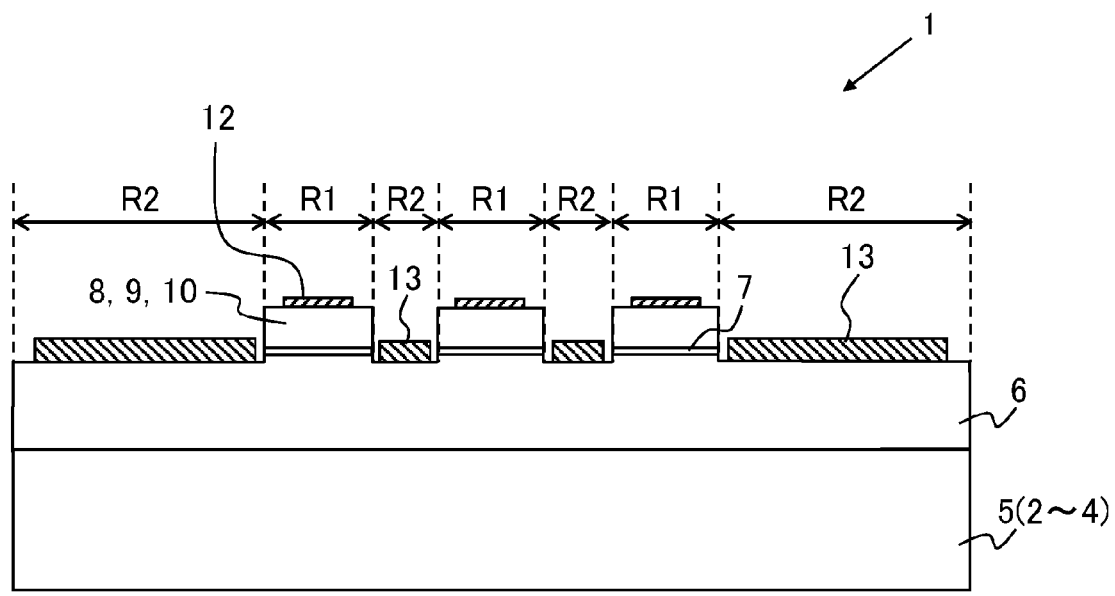
FIG. 2 is a cross-sectional view schematically showing one example of an element structure taken along a line B-B' in the first to fifth embodiments of the nitride semiconductor ultraviolet light-emitting element in the present invention, in which the protective insulating film, and the first and second plated electrodes are not formed yet.
Figure 2:
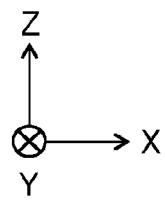
Figure 3:
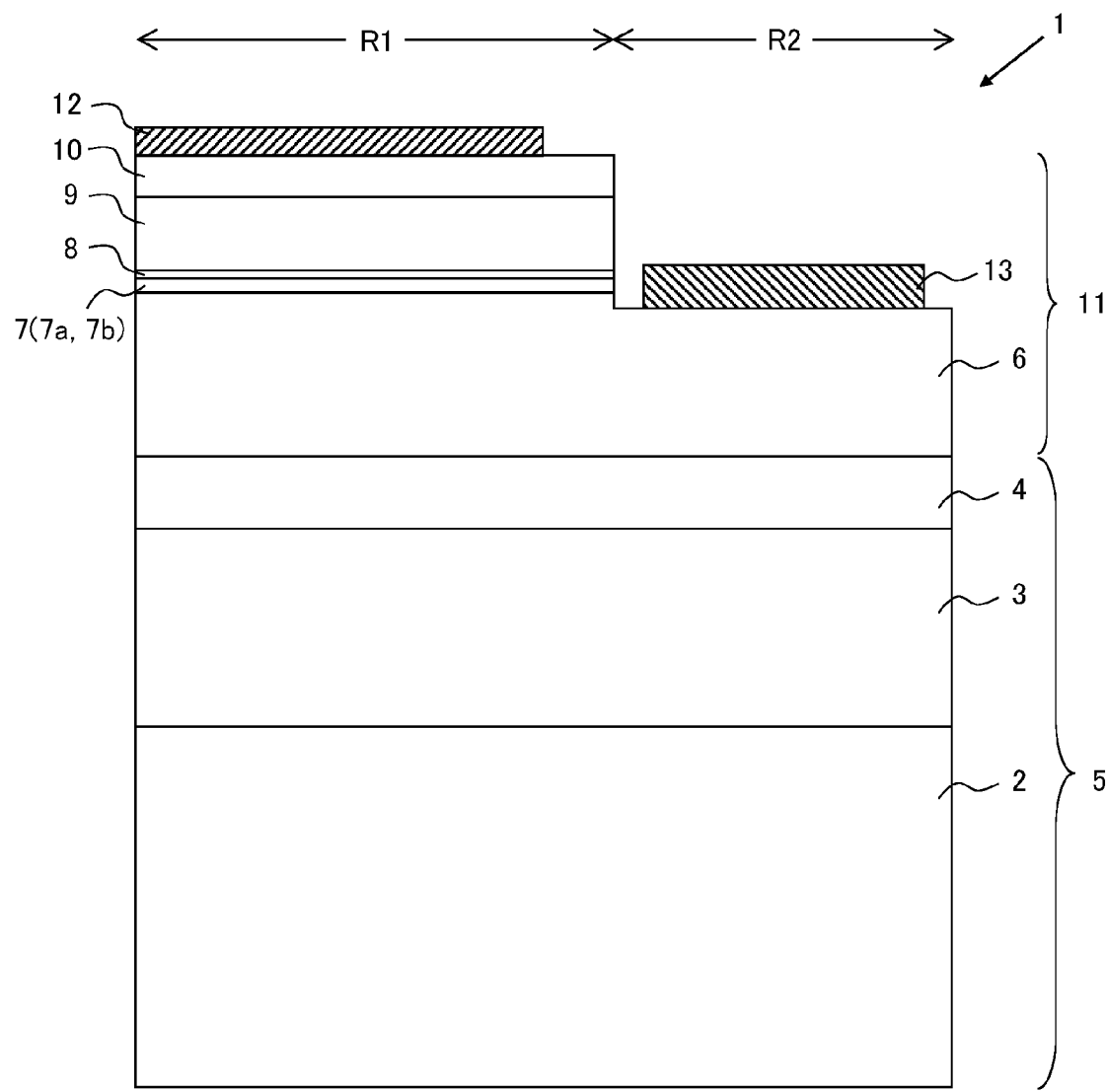
FIG. 3 is an essential part cross-sectional view schematically showing an essential part of the element structure shown in FIGS. 1 and 2.

As shown in FIGS. 1 to 3, the present light-emitting element 1 includes a template 5 in which an AlN layer 3 and an AlGaN layer 4 have been grown on a sapphire (0001) substrate 2, and a semiconductor laminated portion 11 including an n-type clad layer 6 composed of n-type AlGaN, an active layer 7, an electron block layer 8 composed of p-type AlGaN and having a higher AlN mole fraction than the active layer 7, a p-type clad layer 9 composed of p-type AlGaN, and a p-type contact layer 10 composed of p-type GaN which are sequentially laminated on the template 5. The n-type clad layer 6 corresponds to a first semiconductor layer, and each of the electron block layer 8, the p-type clad layer 9, and the p-type contact layer 10 corresponds to a second semiconductor layer. The active layer 7, the electron block layer 8, p-type clad layer 9, and the p-type contact layer 10 formed on the n-type clad layer 6 in a certain planarly-viewed region (second region R2) are removed by reactive ion etching until a surface of the n-type clad layer 6 is exposed, and the laminated structure from the active layer 7 to the p-type contact layer 10 in a first region R1 is formed on the n-type clad layer 6. The active layer 7 has a single-layer quantum well structure composed of an n-type AlGaN barrier layer 7a having a thickness of 10 nm, and an AlGaN or GaN well layer 7b having a thickness of 3.5 nm, for example. The active layer 7 has a double hetero junction structure in which it is sandwiched between the lower and upper n-type and p-type AlGaN layers each having a higher AlN mole fraction, or may have a multiple quantum well structure composed of a plurality of the above single-layer quantum well structures.

Each AlGaN layer is formed by a known epitaxial growth method such as metal-organic vapor phase epitaxy (MOVPE) method or molecular beam epitaxy (MBE) method, in which Si is used as a donor impurity for the n-type layer, and Mg is used as an acceptor impurity for the p-type layer, for example. Furthermore, when a conductivity type is not shown in the AlN layer and the AlGaN layer, the layers are undoped layers which are not doped with an impurity. As for thicknesses of the AlGaN layers other than the active layer 7, for example, the n-type clad layer 6 is 2000 nm, the electron block layer 8 is 2 nm, the p-type clad layer 9 is 540 nm, and the p-type contact layer 10 is 200 nm. However, the thickness of each AlGaN layer is not limited to the above value.

A p electrode 12 composed of Ni/Au, for example, is formed on a surface of the p-type contact layer 10, and an n electrode 13 composed of Ti/Al/Ti/Au, for example, is formed on the surface of the n-type clad layer 6 in the second region R2. Furthermore, the number, materials, and thicknesses of the metal layers in each of the p electrode 12 and the n electrode 13 are not limited to the above number and materials, and the thicknesses to be described below.

Figure 8:
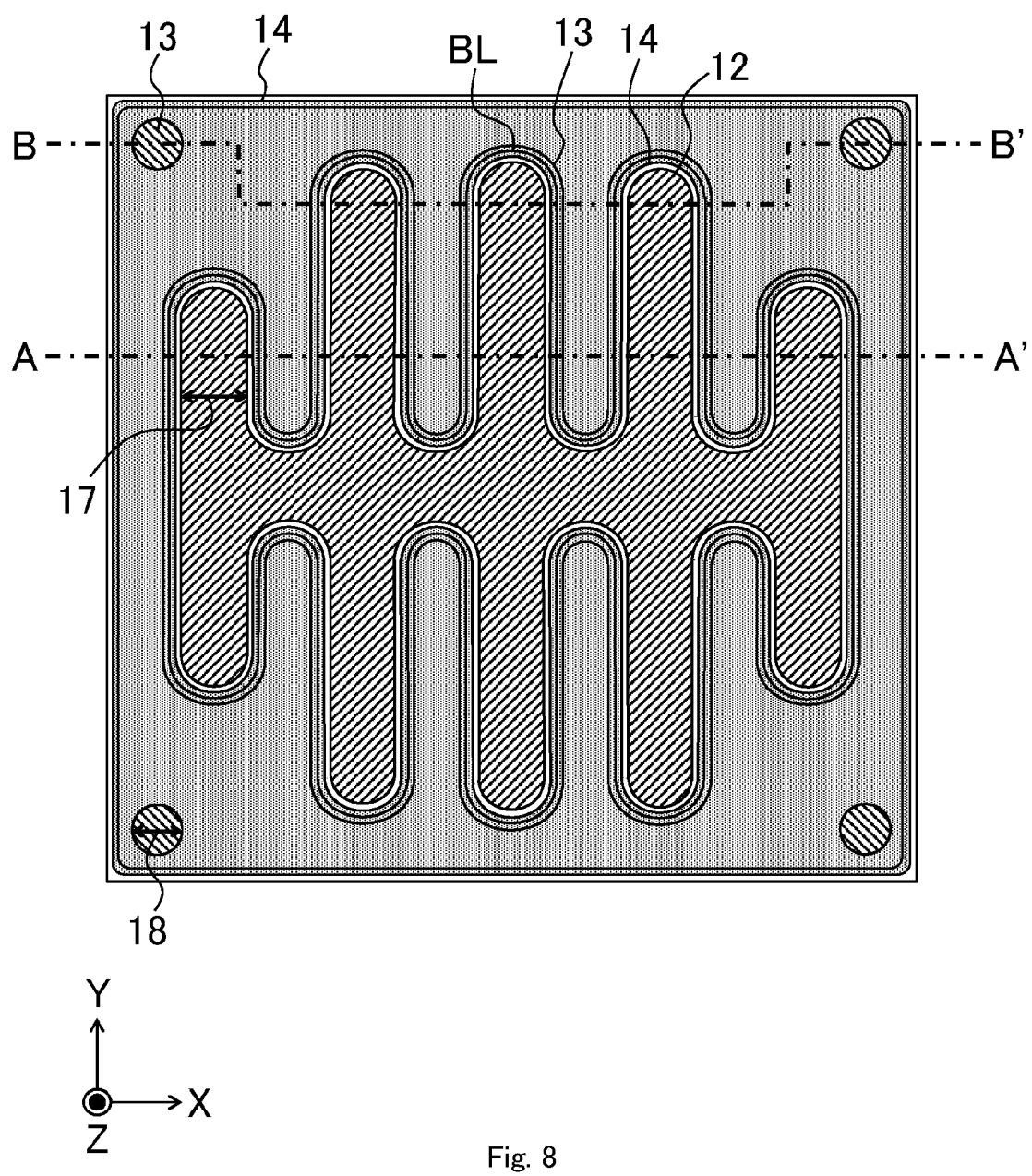
FIG. 8 is a plan view schematically showing one example of a planar structure and a planarly-viewed pattern of the protective insulating film in the first to fifth embodiments of the nitride semiconductor ultraviolet light-emitting element in the present invention, in which the first and second plated electrodes are not formed yet.

Here, when a region that one unit of the present light-emitting element 1 (one light-emitting element) is formed in a plane parallel to a surface of the substrate 2 is defined as an element region for descriptive purpose, the element region is composed of the first region R1 and the second region R2. In addition, in the following description, the element region does not include a scribing region serving as a cutting margin used when the plurality of present light-emitting elements 1 arranged in a matrix on a wafer are diced into individual chips. Furthermore, for descriptive purposes, an X-Y-Z rectangular coordinate system is supposed in which an X-Y plane is parallel to the surface of the substrate 2, a Z direction is a thickness direction of the element, and X-Y coordinates (0, 0) is a center of the element region of the present light-emitting element 1. Thus, FIG. 1 is a cross-sectional view of the present light-emitting element 1 parallel to an X-Z plane along a line A-A' in a plan view shown in FIG. 8, and FIG. 2 is a cross-sectional view of the present light-emitting element 1 parallel to the X-Z plane along a line B-B' in the above plan view. FIGS. 1 and 2 each schematically shows an element structure in a state where the semiconductor laminated portion 11 is formed on the template 5, and the p electrode 12 and the n electrode 13 are formed on the semiconductor laminated portion, but a protective insulating film 14, a first plated electrode 15, and a second plated electrode 16 which will be described below are not formed yet. Hereinafter, for descriptive purposes, the element structure of the present light-emitting element 1 in which the protective insulating film 14 and the first and second plated electrodes 15 and 16 are not formed yet is referred to as the "pre-plating element structure". FIG. 3 schematically shows an essential part cross-sectional view of the pre-plating element structure of the present light-emitting element 1 shown in FIGS. 1 and 2.

As shown in FIGS. 1 to 3, the semiconductor laminated portion 11 in the first region R1 has a multiple-layer structure including the n-type clad layer 6 to the p-type contact layer 10 and projects from the exposed surface of the n-type clad layer 6 in the second region R2 in the Z direction. Hereinafter, the semiconductor laminated portion 11 in the first region R1 is referred to as the "mesa" for descriptive purposes. An uppermost surface of the mesa is an upper surface of the p-type contact layer 10, and a difference in the Z direction between the uppermost surface of the mesa (in the first region R1) and the exposed surface of the n-type clad layer 6 (in the second region R2) (a step difference of the mesa) is found by adding a total thickness from the active layer 7 to the p-type contact layer 10, to a depth removed from the surface of the n-type clad layer 6 by the etching process in the −Z direction, which is about 800 nm. If a dimension (chip size) of the element region in the X and Y directions is about 0.8 mm to 1.5 mm, the above step difference is extremely as small as 0.1% or less of the chip size, which considerably differs from the schematically illustrated dimension ratio in the drawings.

Figure 4:
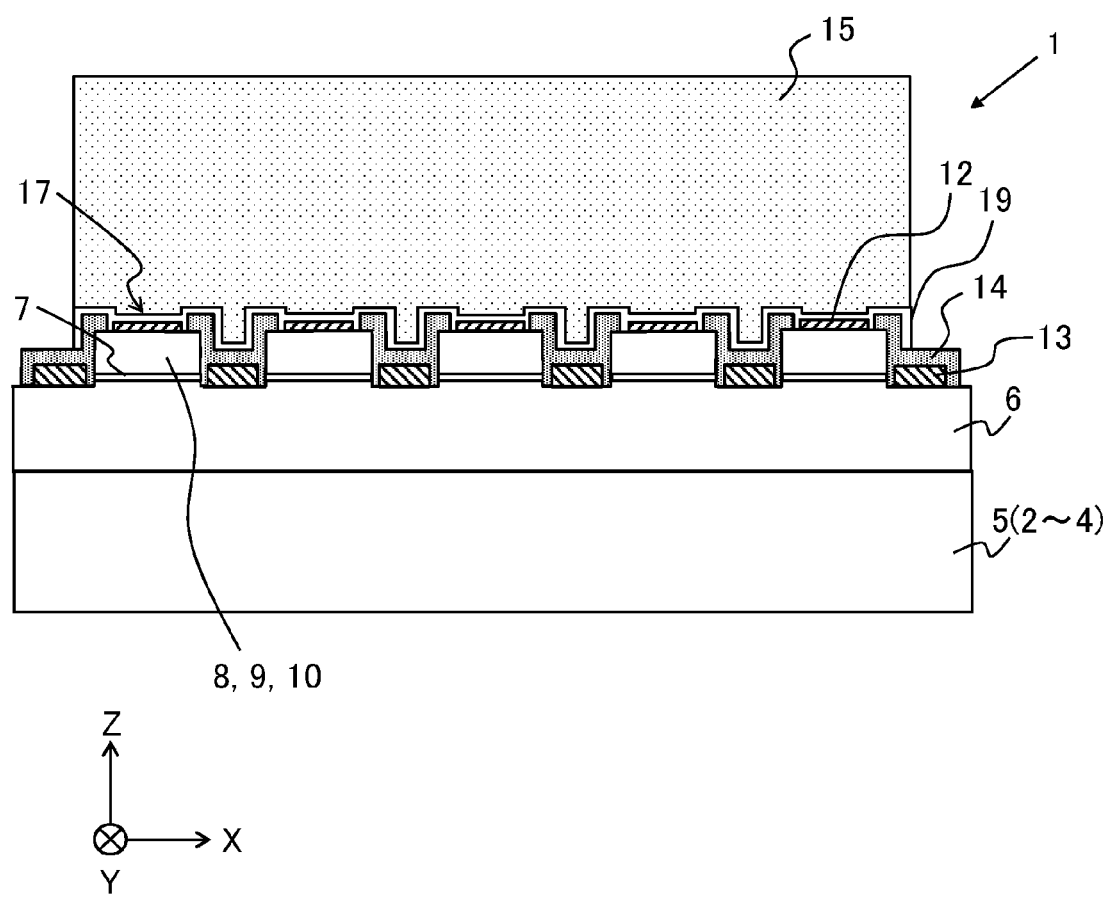
FIG. 4 is a cross-sectional view schematically showing one example of an element structure taken along the line A-A' in the first and fifth embodiments of the nitride semiconductor ultraviolet light-emitting element in the present invention, in which the protective insulating film, and the first and second plated electrodes are formed.
Figure 5:
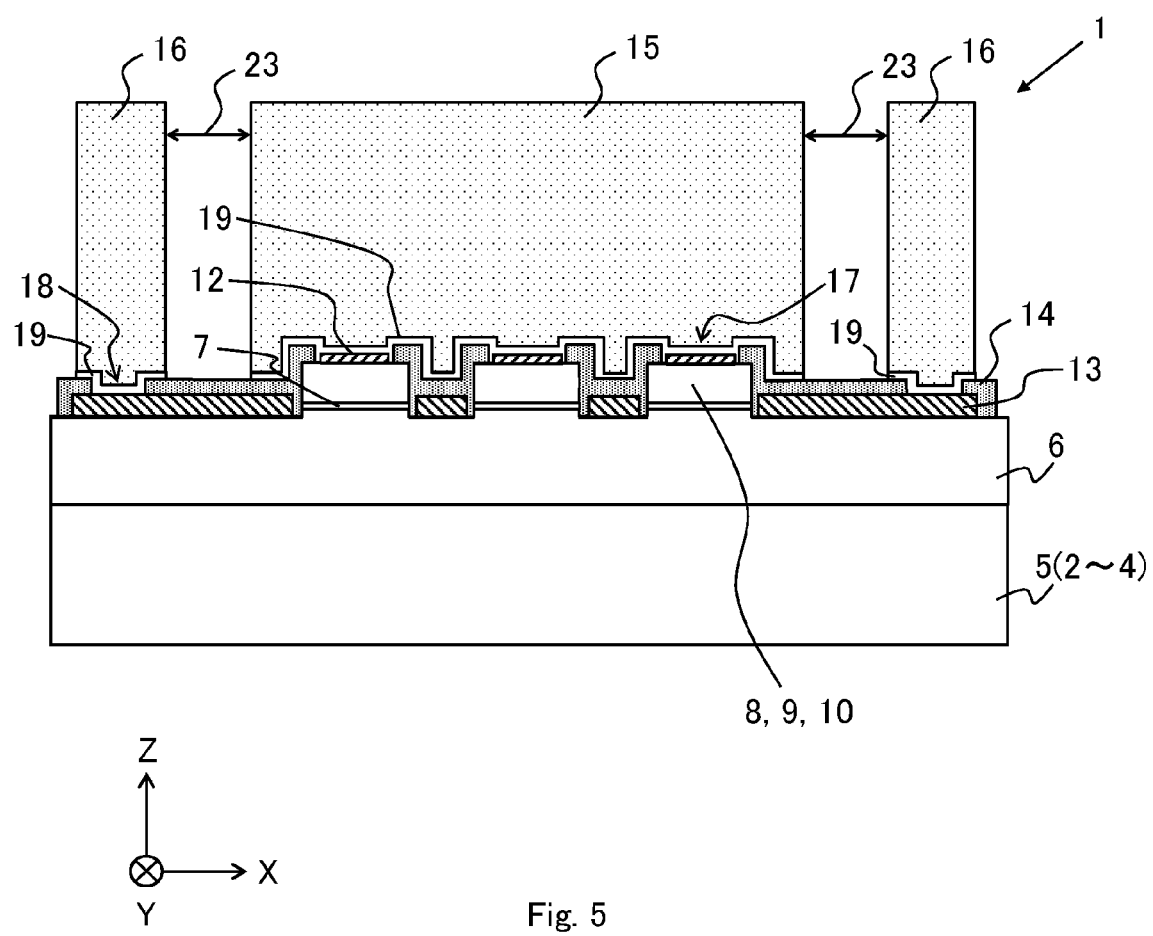
FIG. 5 is a cross-sectional view schematically showing one example of an element structure taken along the line B-B' in the first and fifth embodiments of the nitride semiconductor ultraviolet light-emitting element in the present invention, in which the protective insulating film, and the first and second plated electrodes are formed.

FIGS. 4 and 5 schematically show one example of an element structure of the present light-emitting element 1 in which the protective insulating film 14, the first plated electrode 15, and the second plated electrode 16 are formed. FIG. 4 is a cross-sectional view parallel to the X-Z plane along the line A-A' in the plan view in FIG. 8, and FIG. 5 is a cross-sectional view of the present light-emitting element 1 parallel to the X-Z plane along the line B-B' in the above plan view. In FIGS. 1 to 5, hatched portions correspond to the p electrode 12 and the n electrode 13, and in FIGS. 4 and 5, a dot-patterned portion correspond to the first and second plated electrodes 15 and 16 (the same is true in FIGS. 10 to 12, and 15).

Figure 6:
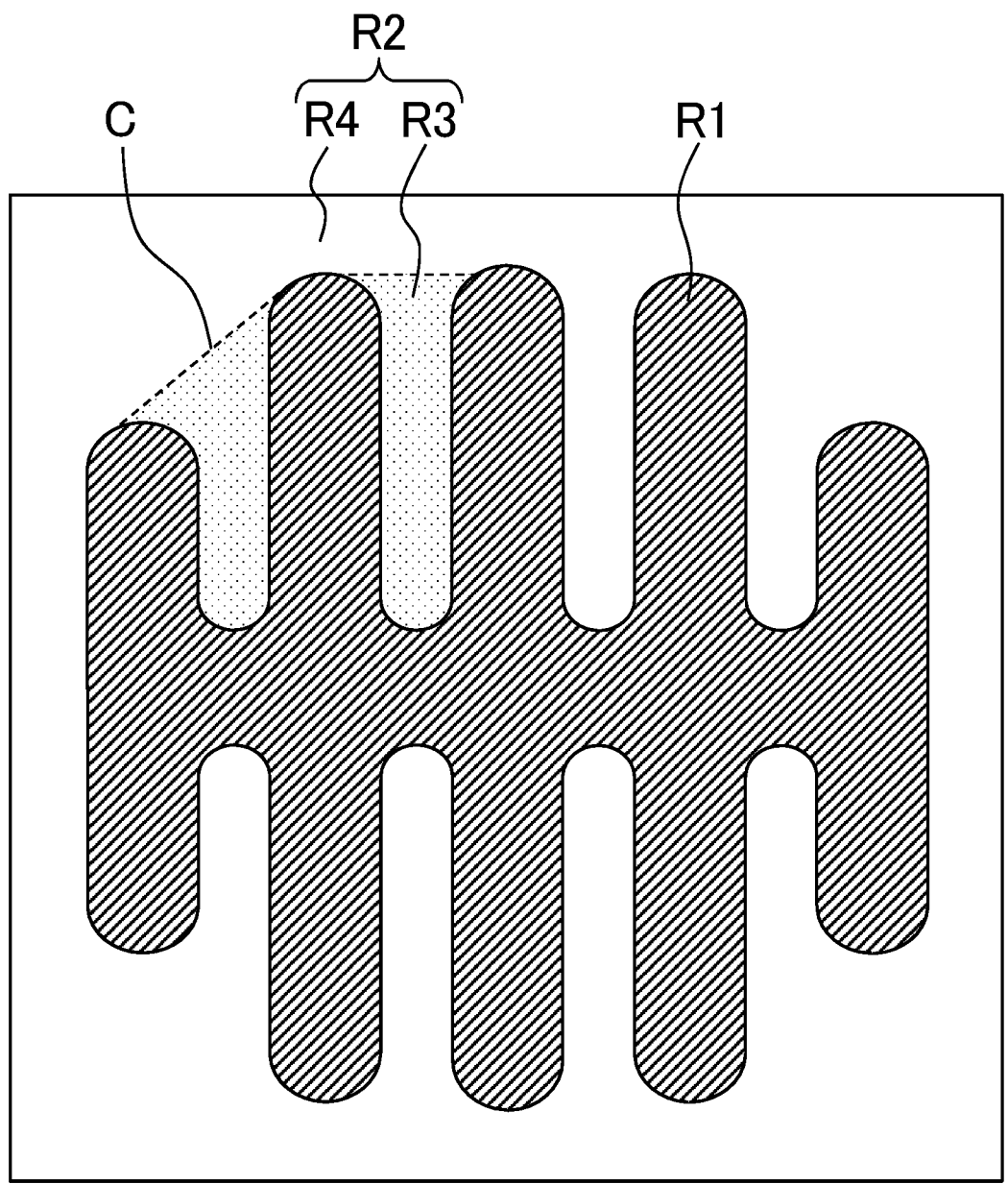
FIG. 6 is a plan view schematically showing one example of a planar structure and a planarly-viewed pattern of a first region and a second region in the first to fifth embodiments of the nitride semiconductor ultraviolet light-emitting element in the present invention, in which a p electrode, an n electrode, and the first and second plated electrodes are not formed yet.

FIG. 6 shows one example of a planarly-viewed pattern of the first region R1 and the second region R2 in which the p electrode 12, the n electrode 13, the first plated electrode 15, and the second plated electrode 16 are not formed yet. In FIG. 6, a hatched portion corresponds to the first region R1. In a planarly-viewed pattern in FIG. 6, the first region R1 has a comb-like shape having four recesses in an upper side (Y>0) in the drawing, and four recesses in a lower side (Y<0) in the drawing. In FIG. 6, in the second region R2, a dot-patterned portion is applied to two recessed regions R3 each surrounded by the recess from three directions, to separate the recessed region R3 from a periphery region in the second region R2. The second region R2 includes eight recessed regions R3, and the periphery region R4 which surrounds the recessed regions R3 and the first region R1. In FIG. 6, a broken line C shows a boundary between the recessed region R3 and the periphery region R4. Furthermore, in the recessed region R3 surrounded by the recess from the three directions in FIG. 6, a straight line passing through a certain point in the recessed region R3 surely intersects with the first region R1. As for a part of the straight line, both sides provided across the certain point intersect with the first region R1, while as for the other part of the straight line, one side provided across the certain point intersects with the first region R1 but the other side thereof does not intersect with the first region R1.

Figure 7:
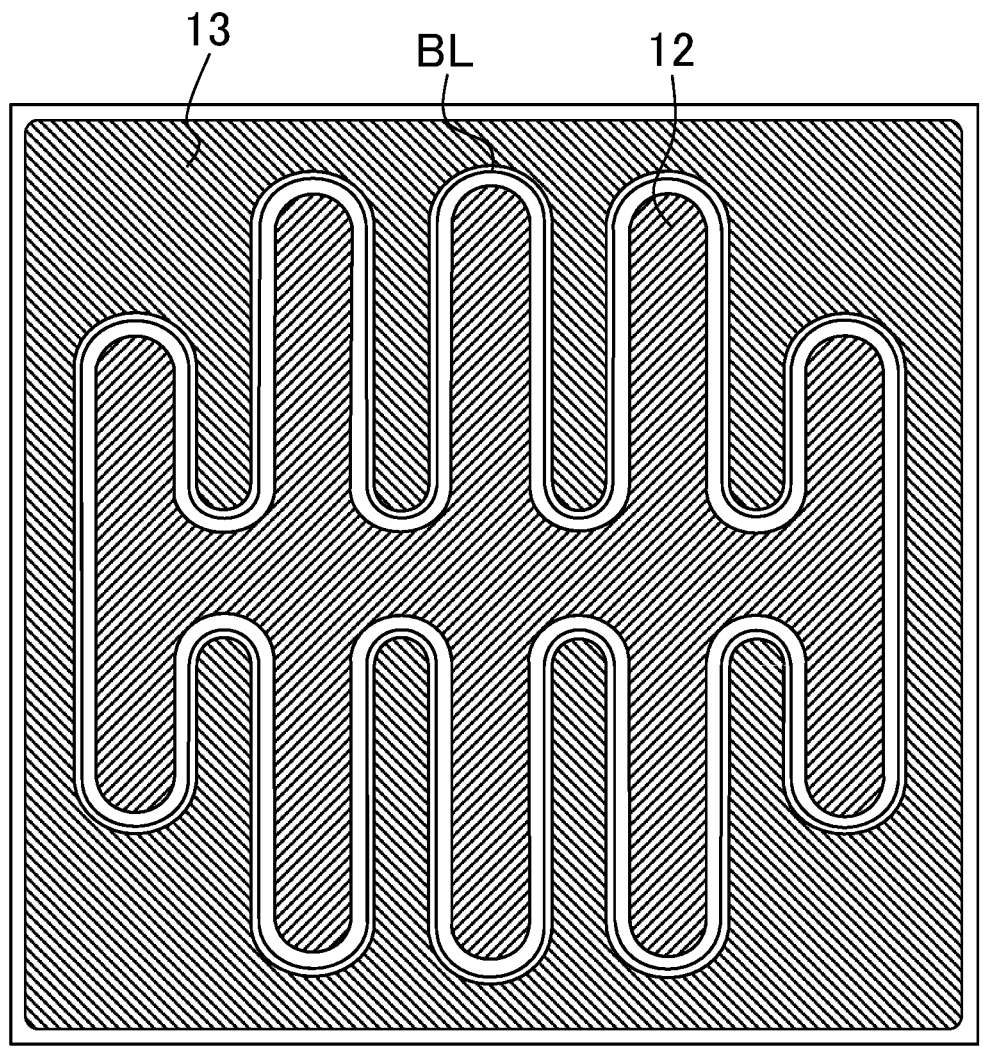
FIG. 7 is a plan view schematically showing one example of a planar structure and a planarly-viewed pattern of the p electrode and the n electrode in the first to fifth embodiments of the nitride semiconductor ultraviolet light-emitting element in the present invention, in which the first and second plated electrodes are not formed yet.

FIG. 7 shows one example of the planarly-viewed pattern of the p electrode 12 and the n electrode 13 in which the first plated electrode 15 and the second plated electrode 16 are not formed yet. In FIG. 7, hatched portions correspond to the p electrode 12 and the n electrode 13. Furthermore, a boundary line BL between the first region R1 and the second region R2 is shown for reference. It can be seen from FIG. 7, compared with FIG. 6, that the n electrode 13 is continuously formed over the recessed region R3 and the periphery region R4 and formed circularly around the first region R1. Furthermore, the p electrode 12 is formed into a comb-like shape having recesses on an upper side and a lower side in the drawing, similar to the first region R1. An outer line of the p electrode 12 is retreated inside the first region R1 from an outer line (boundary line between the first region R1 and the second region R2) of the first region R1 by about 10 μm, for example. Furthermore, an inner line of the n electrode 13 is retreated toward the second region R2 from the outer line of the first region R1 by about 10 μm, and an outer line of the n electrode 13 is retreated inside from an outer line of the element region and further retreated inside from an outer line of the protective insulating film 14 by about 10 μm, for example.

FIG. 8 shows one example of a planarly-viewed pattern of the protective insulating film 14 in which the first plated electrode 15 and the second plated electrode 16 are not formed yet. The protective insulating film 14 is provided almost a whole surface of the element region, and its outer line is provided in alignment with the outer line of the element region or may be slightly retreated inside from the outer line of the element region by about 10 μm, for example. The protective insulating film 14 has a first opening 17 in the first region R1, and four second openings 18 at four corners in the periphery region R4. The p electrode 12 and the n electrode 13 are exposed in the first opening 17 and the second opening 18, respectively without being covered with the protective insulating film 14. Therefore, the n electrode 13 is covered with the protective insulating film 14 except for the portion exposed in the second opening 18. An outer line of the first opening 17 is retreated inside the first region R1 from the outer line of the first region R1 by about 5 μm to 15 μm, for example. Here, the outer line of the first opening 17 may be provided on the same position, outside, or inside the outer line of the p electrode 12. In FIG. 8, a dot-patterned portion corresponds to the protective insulating film 14, and hatched portions correspond to the p electrode 12 exposed in the first opening 17 and the n electrode 13 exposed in the second opening 18. Furthermore, the boundary line BL between the first region R1 and the second region R2 is shown for reference.

In this embodiment, the protective insulating film 14 is a $SiO_2$ film or $Al_2O_3$ film formed by chemical vapor deposition (CVD) to have a thickness of 100 nm to 1 μm, and more preferably a thickness of 150 nm to 350 nm. As shown in FIGS. 4, 5, and 8, the protective insulating film 14 covers at least a whole outer side surface of the semiconductor laminated portion 11 (side wall surface of the step difference portion of the mesa) in the first region R1, the exposed surface of the n-type clad layer 6 between the first region R1 and the n electrode 13, and an upper surface and a side surface of an outer edge portion of the n electrode 13 including a portion which is at least facing the first region R1. However, the protective insulating film 14 does not cover and exposes at least one portion of the surface of the p electrode 12 in the first opening 17, and does not cover and exposes at least one portion of the surface of the n electrode 13 in the second opening 18. Thus, the first plated electrode 15 is electrically connected to the p electrode 12 through the first opening 17 and a seed film 19 which will be described below, and the second plated electrode 16 is electrically connected to the n electrode 13 through the second opening 18 and a seed film 19 which will be described below.

Furthermore, the protective insulating film 14 is provided to prevent the first plated electrode 15 from being in direct contact with the exposed surface of the n-type clad layer 6 and the side end surface of the p-type clad layer 9 so that a bypass is prevented from being formed in a current path from the p-type clad layer 9 to the n-type clad layer 6 through the active layer 7. Therefore, even in a case where the protective insulating film 14 is slightly retreated toward a lower portion from an upper end of the step difference portion of the mesa, and the upper end of a side wall of the step difference portion of the mesa, that is, a side end surface of the p-type contact layer 10 is partially exposed and is in direct contact with the first plated electrode 15, the bypass is not formed, so that the light-emitting operation can be properly performed. Therefore, in FIGS. 4, 5, and 8, the protective insulating film 14 covers the exposed surface of the p-type contact layer 10 which is not covered with the p electrode 12, but the exposed surface of the p-type contact layer 10 is not necessarily covered with the protective insulating film 14. The protective insulating film 14 does not cover an outer end of the p electrode 12 in FIGS. 4, 5, and 8, but the protective insulating film 14 may cover the outer end of the p electrode 12.

Figure 9:
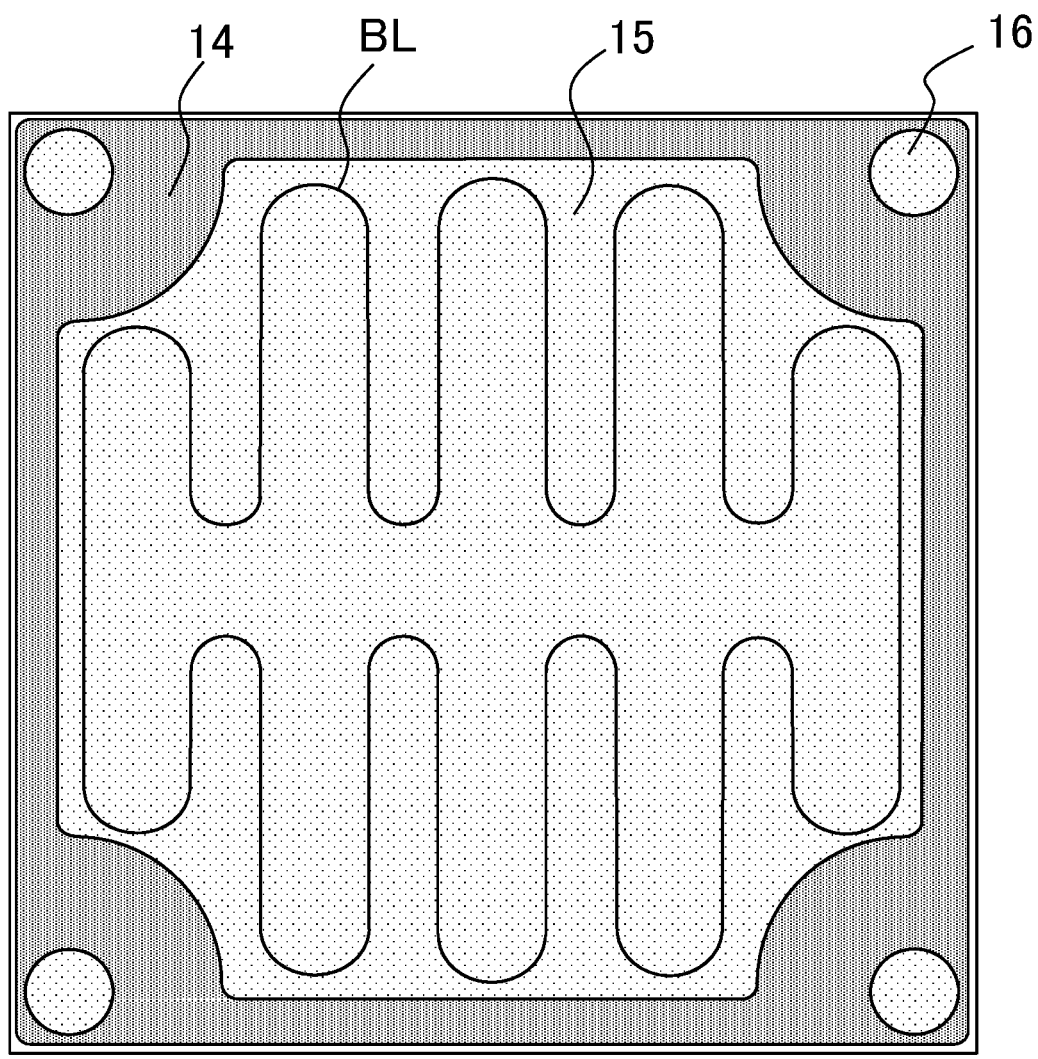
FIG. 9 is a plan view schematically showing one example of a planarly-viewed pattern of the first and second plated electrodes in the first to fifth embodiments of the nitride semiconductor ultraviolet light-emitting element in the present invention.

FIG. 9 shows one example of a planarly-viewed pattern of the first plated electrode 15 and the second plated electrode 16. In FIG. 9, a dot-patterned portion corresponds to the first plated electrode 15 and the second plated electrode 16. Furthermore, the boundary line BL between the first region R1 and the second region R2 is shown for reference. Each of outer lines of the first plated electrode 15 and the second plated electrode 16 is located on the protective insulating film 14 in the second region R2, and an adjacent distance between the first plated electrode 15 and the second plated electrode 16 is 75 µm or more. This distance is preferably 100 µm or more, and more preferably 100 □m to 150 µm. The outer line of the first plated electrode 15 is preferably located on the n electrode 13 through the protective insulating film 14, but the outer line of the first plated electrode 15 may have a part which is not located above the n electrode 13, depending on the planarly-viewed shape of the n electrode 13. Furthermore, in FIG. 9, the outer line of the first plated electrode 15 is located in the periphery region R4 in the second region R2, but the outer line of the first plated electrode 15 may partially enter the recessed region R3, depending on a shape or a size of the recessed region R3. The outer line of the second plated electrode 16 is preferably provided outside the outer line of the second opening 18 of the protective insulating film 14 by about 0 µm to 30 µm, for example. However, the outer line of the second plated electrode 16 may be partially or entirely provided in alignment with or inside the outer line of the second opening 18 of the protective insulating film 14. This is because even in this case, the n electrode 13 not covered with the second plated electrode 16 is only exposed from the second opening 18, so that there is no problem in particular as long as a distance between the exposed n electrode 13 and the first plated electrode 15 can be ensured similarly to the above distance between the first plated electrode 15 and the second plated electrode 16, and as long as an area of an upper surface of the second plated electrode 16 is large enough to be properly soldered as will be described below. The second region R2 provided inside the outer line of the first plated electrode 15 corresponds to a part of the second region R2 provided in the first plated electrode 15, that is, this part corresponds to a boundary region which is in contact with the first region R1.

In this embodiment, each of the first and second plated electrodes 15 and 16 is made of copper by a known electrolytic plating method. Furthermore, each of the first and second plated electrodes 15 and 16 may be made of alloy containing copper as a main component and metal such as lead (Pb), iron (Fe), zinc (Zn), manganese (Mn), nickel (Ni), cobalt (Co), beryllium (Be). However, when the alloy is used, heat conductivity becomes low, so that copper is preferably used.

As shown in FIGS. 4, 5, and 9, the first plated electrode 15 is formed to cover the whole uppermost layer of the first region R1 including the exposed surface of the p electrode 12 which is not covered with the protective insulating film 14, the whole outer side surface of the semiconductor laminated portion 11 (side wall surface of the step difference portion of the mesa) in the first region R1 which is covered with the protective insulating film 14, and the boundary region which is in contact with the first region R1 and surrounds the first region R1, as one part of the second region R2. Furthermore, as shown in FIGS. 4, 5, and 9, the second plated electrode 16 is formed at least on the exposed n electrode 13 in the second opening 18 of the protective insulating film 14, and preferably also formed on the protective insulating film 14 provided around the second opening 18. Since the second plated electrode 16 is circular in planar view in FIG. 9, the outer line of the first plated electrode 15 which is adjacently opposed to the second plated electrode 16 is designed to have an arc shape, so that the distance can be kept constant between the first plated electrode 15 and the second plated electrode 16 in this adjacently opposed region. Thus, an electric field is prevented from locally concentrating between the first plated electrode 15 and the second plated electrode 16. Therefore, in this viewpoint, the planarly-viewed shape of the second plated electrode 16 may be a fan shape other than the circular shape. In addition, the planarly-viewed shape of the second plated electrode 16 may be a rectangular shape having at least an arc-shaped corner which is opposed to the first plated electrode 15.

The thickness of each of the first and second plated electrodes 15 and 16 may be 45 µm or more, or a half or more of a distance between the first plated electrodes 15 with the recessed region R3 provided therebetween. Especially, the thickness of each of the first and second plated electrodes 15 and 16 is preferably 45 µm to 100 µm, and more preferably 50 µm to 75 µm in the viewpoint of the manufacturing process. When the thickness is too small, each of the plated electrodes 15 and 16 is likely to be affected by warpage of the wafer, and its surface becomes hard to planarize, so that the thickness is preferably 45 µm or more.

Furthermore, the first and second plated electrodes 15 and 16 can be readily formed to have the thickness of 45 µm or more by the electrolytic plating method included in a wet plating method, without using a method included in a dry plating method such as vapor deposition which is used in a wafer manufacturing process. If the electrode having the same thickness as those of the first and second plated electrodes 15 and 16 is formed by the vapor deposition, it takes too long to form the film, which is extremely low in efficiency and not realistic. On the other hand, if the first and second plated electrodes 15 and 16 are formed not by the electrolytic plating but by the vapor deposition within a realistic time, the thickness is as thin as the p electrode 12 and the n electrode 13, so that the first plated electrode 15 cannot have a wholly flat surface. Thus, a planarly-viewed shape of an uppermost surface of the first plated electrode 15 is almost the same as the planarly-viewed shape of the first region R1, so that a contact area with an electrode pad on a package cannot be large after the flip-chip mounting. Thus, the thin first plated electrode 15 only complicates an electrode structure and cannot achieve an original purpose of efficiently releasing the waste heat generated due to light emission.

on the n-type clad layer 6. A thickness of the four-layer metal film of Ti/Al/Ti/Au is, for example, 20 nm/100 nm/50 nm/100 nm, respectively.

Subsequently, a photoresist having a reverse pattern of the p electrode 12 is formed on the whole substrate surface, and a two-layer metal film of Ni/Au is deposited as the p electrode 12 by an electron beam evaporation method. The photoresist is removed by a liftoff method, the two-layer metal film on the photoresist is peeled-off, and heat treatment such as RTA is performed at 450° C., for example. Accordingly, the p electrode 12 is formed on the surface of the p-type contact layer 10. A thickness of the two-layer metal film of Ni/Au is, for example, 60 nm/50 nm, respectively.

Thus, the pre-plating element structure of the present light-emitting element 1 as shown in FIGS. 1 and 2 is completed. The pre-plating element structure shown in FIGS. 1 and 2 has the semiconductor laminated portion 11, the p electrode 12, and the n electrode 13 which are required to serve as the light-emitting element, so that the present light-emitting element 1 may be mounted on a submount in this stage by flip-chip mounting and sealed with resin so as to be able to function as the light-emitting element.

FIGS. 4 and 5 each show the cross-sectional structure of the first plated electrode 15 and the second plated electrode 16 formed by the electrolytic plating method, and the seed film 19 for feeding a power in the electrolytic plating is formed under the first plated electrode 15 and the second plated electrode 16. The power-feeding seed film 19 in the electrolytic plating is made of a Ni film or Ti/Cu film having a thickness of about 10 nm to 100 nm. The seed film 19 is not limited to the Ni film or the Ti/Cu film as long as the seed film 19 is made of an electrically conductive material having a bonding property to the protective insulating film 14 at the lower side and the first and second plated electrodes 15 and 16 at the upper side.

In addition, in this embodiment, as shown in FIGS. 6 to 9, the planarly-viewed shapes of the first and second regions R1 and R2, the protective insulating film 14, and the first and second plated electrodes 15 and 16 are linearly symmetrical with respect to the X axis and the Y axis, but they are not necessarily linearly symmetrical with respect to the X axis and the Y axis. For example, the second plated electrodes 16 and the second openings 18 are not always required to be provided at four corners, and the second plated electrodes 16 and the second openings 18 may be provided at any number of positions in the periphery region R4, such as at two diagonal corners in the periphery region R4. Furthermore, the planarly-viewed shapes of the first region R1, the p electrode 12, and the first opening 17 are not limited to the comb-like shape as shown in FIGS. 6 to 8.

Hereinafter, a method for manufacturing the present light-emitting element 1 will be described. First, a brief description will be given to a process for manufacturing the pre-plating element structure shown in FIGS. 1 and 2 in which the protective insulating film 14, the first plated electrode 15, and the second plated electrode 16 are not formed yet.

First, the template 5 and layers from the n-type clad layer 6 to the p-type contact layer 10 are formed on the sapphire (0001) substrate 2 by a known growth method such as MOVPE method. After the p-type contact layer 10 is formed, a heat treatment is performed, for example, at 800° C. to activate the acceptor impurity. Then, the surface of the p-type contact layer 10 in the first region R1 is covered with, for example, a Ni mask by a known photolithography method, and the layers from the active layer 7 to the p-type contact layer 10 formed on the n-type clad layer 6 in the region except for the first region R1 are removed by reactive ion etching until the surface of the n-type clad layer 6 is exposed. After that, the Ni mask is removed. As a result, the semiconductor laminated portion 11 including the n-type clad layer 6 to the p-type contact layer 10 is formed on the template 5 in the first region R1, and the n-type clad layer 6 having the exposed surface is formed on the template 5 in the second region R2.

Subsequently, a photoresist having a reverse pattern of the n electrode 13 is formed on the whole surface of the substrate, and a four-layer metal film of Ti/Al/Ti/Au is deposited as the n electrode 13 by an electron beam evaporation method. The photoresist is removed by a liftoff method, the four-layer metal film on the photoresist is peeled-off, and a heat treatment such as rapid thermal anneal (RTA) is performed as needed. Accordingly, the n electrode 13 is formed on the n-type clad layer 6. A thickness of the four-layer metal film of Ti/Al/Ti/Au is, for example, 20 nm/100 nm/50 nm/100 nm, respectively.

Subsequently, a photoresist having a reverse pattern of the p electrode 12 is formed on the whole substrate surface, and a two-layer metal film of Ni/Au is deposited as the p electrode 12 by an electron beam evaporation method. The photoresist is removed by a liftoff method, the two-layer metal film on the photoresist is peeled-off, and heat treatment such as RTA is performed at 450° C., for example. Accordingly, the p electrode 12 is formed on the surface of the p-type contact layer 10. A thickness of the two-layer metal film of Ni/Au is, for example, 60 nm/50 nm, respectively.

Thus, the pre-plating element structure of the present light-emitting element 1 as shown in FIGS. 1 and 2 is completed. The pre-plating element structure shown in FIGS. 1 and 2 has the semiconductor laminated portion 11, the p electrode 12, and the n electrode 13 which are required to serve as the light-emitting element, so that the present light-emitting element 1 may be mounted on a submount in this stage by flip-chip mounting and sealed with resin so as to be able to function as the light-emitting element.

However, the present light-emitting element 1 further includes the protective insulating film 14, the first plated electrode 15, and the second plated electrode 16, in addition to the pre-plating structure shown in FIGS. 1 and 2, in order to efficiently release the waste heat generated due to the light-emitting operation. Hereinafter, a process for manufacturing the protective insulating film 14, the first plated electrode 15, and the second plated electrode 16 will be described.

The protective insulating film 14 such as $SiO_2$ film or $Al_2O_3$ film is formed on the whole substrate surface by a method such as CVD method. A thickness of the protective insulating film 14 is about 150 nm to 350 nm, for example. A temperature for forming the protective insulating film 14 is to be about 600° C. which is not higher than a lowest temperature among the film formation temperature and the heat treatment temperature to form the pre-plating element structure shown in FIGS. 1 and 2.

Subsequently, the protective insulating film 14 formed on the whole substrate surface is partially etched away. Specifically, a region except for the first opening 17, the second opening 18, and a scribing region is covered with a mask layer by a known photolithography technique, the protective insulating film 14 formed on the whole substrate surface is removed by dry etching such as known reactive ion etching, and then the mask layer is removed. Thus, the first opening 17 and the second opening 18 are formed in the protective insulating film 14 in the element region. The process until this point is a wafer manufacturing process of a nitride semiconductor, and a process from this point is a plating process which is low in alignment precision. However, the plating process in the following description is performed on the wafer sequentially after the wafer manufacturing process.

Subsequently, the power-feeding seed film 19 to be used for the electrolytic plating is formed on the whole substrate surface by sputtering Ni, for example.

Subsequently, a photo-sensitive sheet film to be used for the plating is pasted on the seed film 19, and the film pasted in the regions for the first plated electrode 15 and the second plated electrode 16 is removed by exposure and developing by photolithography technique to expose the seed film 19. Then, a power is applied to the seed film 19, and the first plated electrode 15 and the second plated electrode 16 are formed on the exposed seed film 19 by an electrolytic plating method. Subsequently, the sheet film which is not covered with the first plated electrode 15 and the second plated electrode 16 is removed by using an organic solvent, and the seed film 19 which is not covered with the first plated electrode 15 and the second plated electrode 16 is removed by wet etching.

Thicknesses of the first plated electrode 15 and the second plated electrode 16 just after the plating process are almost the same, but since the first plated electrode 15 covers the first region R1 and one part of the second region R2, there are step differences among the mesa, the p electrode 12, the n electrode 13, and the first opening in the protective insulating film 14, under the first plated electrode 15. In addition, as for the electrolytic plating method, an electric field is not uniformly applied to the seed film 19 in some cases, which could cause a variation in thickness between the first plated electrode 15 and the second plated electrode 16 just after the plating process. Therefore, due to the step differences and the variation in thickness, the upper surface of the first plated electrode 15 just after plating process is possibly uneven due to the above step differences, and the first plated electrode 15 and the second plated electrode 16 are possibly different in height. Furthermore, the "height" in this embodiment means a distance in the Z direction from a certain position (such as the surface of the substrate 2) in the Z direction.

Therefore, in the first embodiment, the upper surfaces of the first and second plated electrodes 15 and 16 are polished by a known polishing method such as chemical mechanical polishing (CMP) to remove the unevenness and planarize the upper surfaces of the first and second plated electrodes 15 and 16, and to make uniform the height of the upper surfaces of the first and second plated electrodes 15 and 16. The preferable thickness of the polished first plated electrode 15 and the polished second plated electrode 16 (height from the upper surface of the seed film 19 in the second region R2) is 50 μm to 75 μm as described above. Furthermore, the sheet film and the seed film 19 may be removed after this polishing process.

Through the above processes, the first plated electrode 15 and the second plated electrode 16 are formed. In this stage, the present light-emitting element 1 is provided on the wafer, so that after performing a predetermined inspection process, the scribing region of the wafer is cut or divided by a known dicing process. Thus, the present light-emitting element 1 as a chip is provided.

The first plated electrode 15 is electrically connected to the surface of the p electrode 12 exposed in the first opening 17 of the protective insulating film 14, through the seed film 19 right under the first plated electrode 15. Furthermore, the second plated electrode 16 is electrically connected to the surface of the n electrode 13 exposed in the second opening 18 of the protective insulating film 14, through the seed film 19 right under the second plated electrode 16.

As described above, the waste heat due to the light-emitting operation of the present light-emitting element 1 is mostly generated from an inside of the semiconductor laminated portion 11 (mesa) in the first region R1, especially from the active layer 7, so that the waste heat can be efficiently released to the outside through the first plated electrode 15 which is mainly composed of copper having high thermal conductivity and completely covers the upper surface and the side surface of the semiconductor laminated portion 11. Furthermore, the first plated electrode 15 has a large area which covers not only the first region R1 but also one part of the second region R2 in planar view, so that a contact area between the first plated electrode 15 and the electrode pad on the package can be largely ensured after the flip-chip mounting. As a result, a heat releasing effect can be considerably improved compared with a case where the p electrode is connected to the electrode pad on the package by flip-chip mounting without providing the first plated electrode 15.

Second Embodiment

Figure 10:
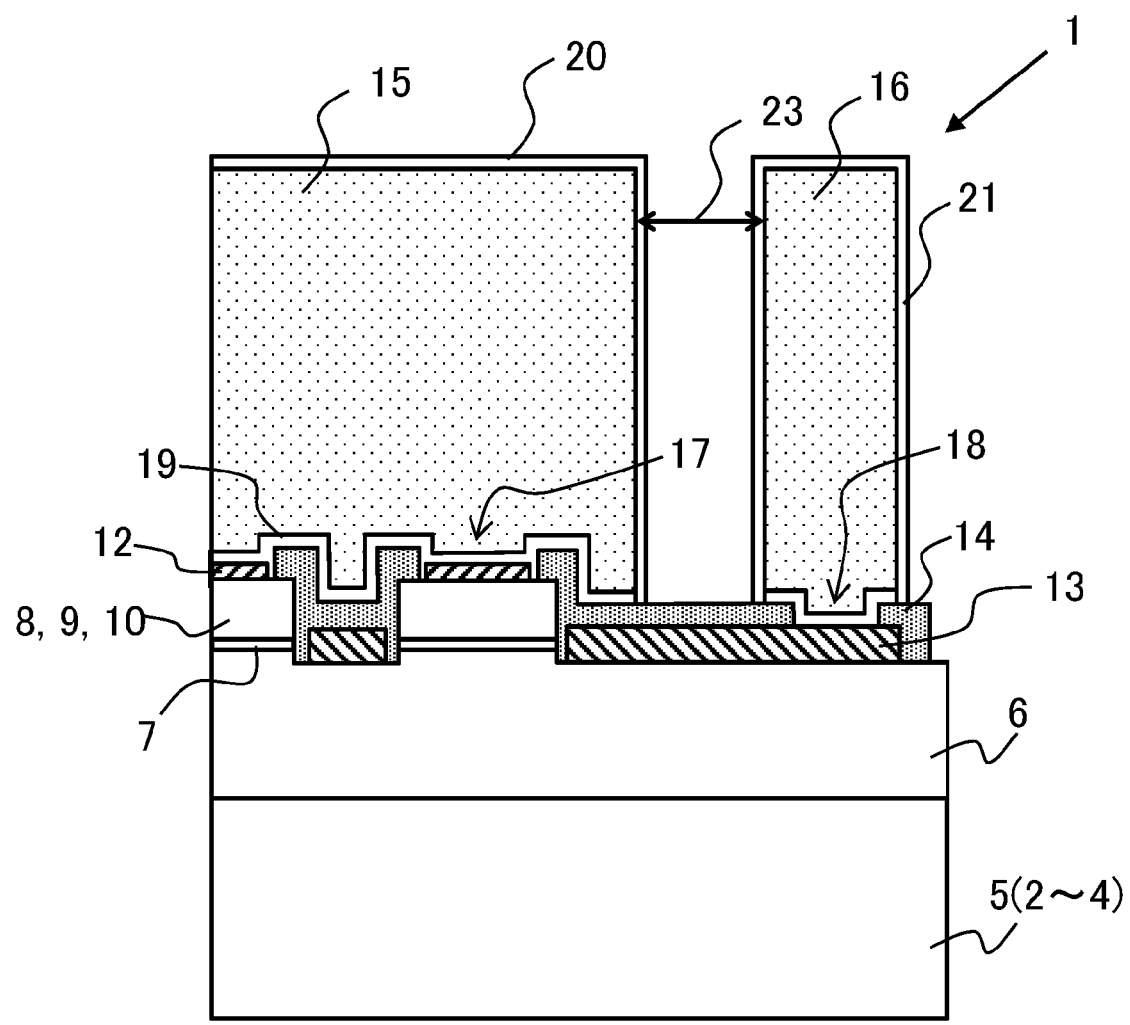
FIG. 10 is a cross-sectional view schematically showing one example of an element structure taken along the line B-B' in the second embodiment of a nitride semiconductor ultraviolet light-emitting element in the present invention.
Figure 10:
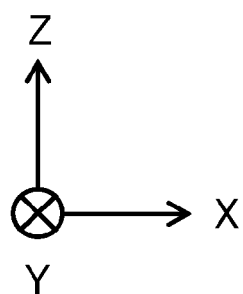

Hereinafter, the second embodiment of the present light-emitting element 1 will be described as one variation of the first embodiment. FIG. 10 schematically shows one example of an element structure in a right side in the Y direction (region of X≥0) in the present light-emitting element 1 of the second embodiment. FIG. 10 is a cross-sectional view of the present light-emitting element 1 parallel to the X-Z plane along the line B-B' in the plan view in FIG. 8.

In the second embodiment, as shown in FIG. 10, the present light-emitting element 1 further includes a plated metal film 20 covering the surface (exposed surface) of the first plated electrode 15, and a plated metal film 21 covering the surface (exposed surface) of the second plated electrode 16. Here, at least uppermost surface of each of the plated metal films 20 and 21 is composed of metal (such as gold (Au)) having smaller ionization tendency than copper composing the first and second plated electrodes 15 and 16, so that even when the present light-emitting element 1 is stored in an oxygen atmosphere during a period before the flip-chip mounting, the surfaces (covered with the plated metal films 20 and 21) of the first and second plated electrodes 15 and 16 are not likely to be oxidized, compared with the case where the surfaces are not covered with the plated metal films 20 and 21. Furthermore, the covered surface can be prevented from being oxidized in a high-temperature process during the soldering process at the time of flip-chip mounting. In addition, in a case where the surfaces of the first and second plated electrodes 15 and 16 have substantially no possibility, that is, no possibility or extremely low possibility, of being oxidized, the plated metal films 20 and 21 are not necessarily provided.

In the second embodiment, after the protective insulating film 14, the first plated electrode 15, and the second plated electrode 16 in the first embodiment are manufactured, the plated metal films 20 and 21 each composed of a three-layer metal film of Ni/Pd/Au sequentially provided from bottom are formed on the exposed surfaces of the polished first plated electrode 15 and the polished second plated electrode 16 by a known electroless plating method included in a wet plating method.

Thicknesses of the layers of Ni/Pd/Au of each of the plated metal films 20 and 21 are 3 μm to 7.5 μm/5 nm to 15 nm/5 nm to 15 nm, from bottom, respectively. Furthermore, each of the plated metal films 20 and 21 is not always required to be composed of the three-layer metal film, and each of the plated metal films 20 and 21 may be a single-layer metal film, or a multiple-layer metal film other than three layers. Furthermore, the materials of the plated metal films 20 and 21 are not limited to the above materials, while the uppermost layer is preferably composed of gold (Au)

The second embodiment differs from the first embodiment in that the surfaces of the first and second plated electrodes 15 and 16 are covered with the plated metal films 20 and 21, respectively. Therefore, planarly-viewed patterns of the plated metal films 20 and 21 in the present light-emitting element 1 in the second embodiment are almost the same as those of the first and second plated electrodes 15 and 16 in the present light-emitting element 1 in the first embodiment shown in FIG. 9 except that they are thicker due to the thicknesses of the plated metal films 20 and 21, so that their drawings are omitted.

In the second embodiment, a distance between the plated metal film 20 covering the first plated electrode 15, and the plated metal film 21 covering the second plated electrode 16 is smaller than the distance between the first and second plated electrodes 15 and 16 due to the thicknesses of the plated metal films 20 and 21. Accordingly, it is preferable that the distance between the first and second plated electrodes 15 and 16 is set previously longer than a desired distance by the thicknesses of the plated metal films 20 and 21 or more.

Third Embodiment

Figure 11:
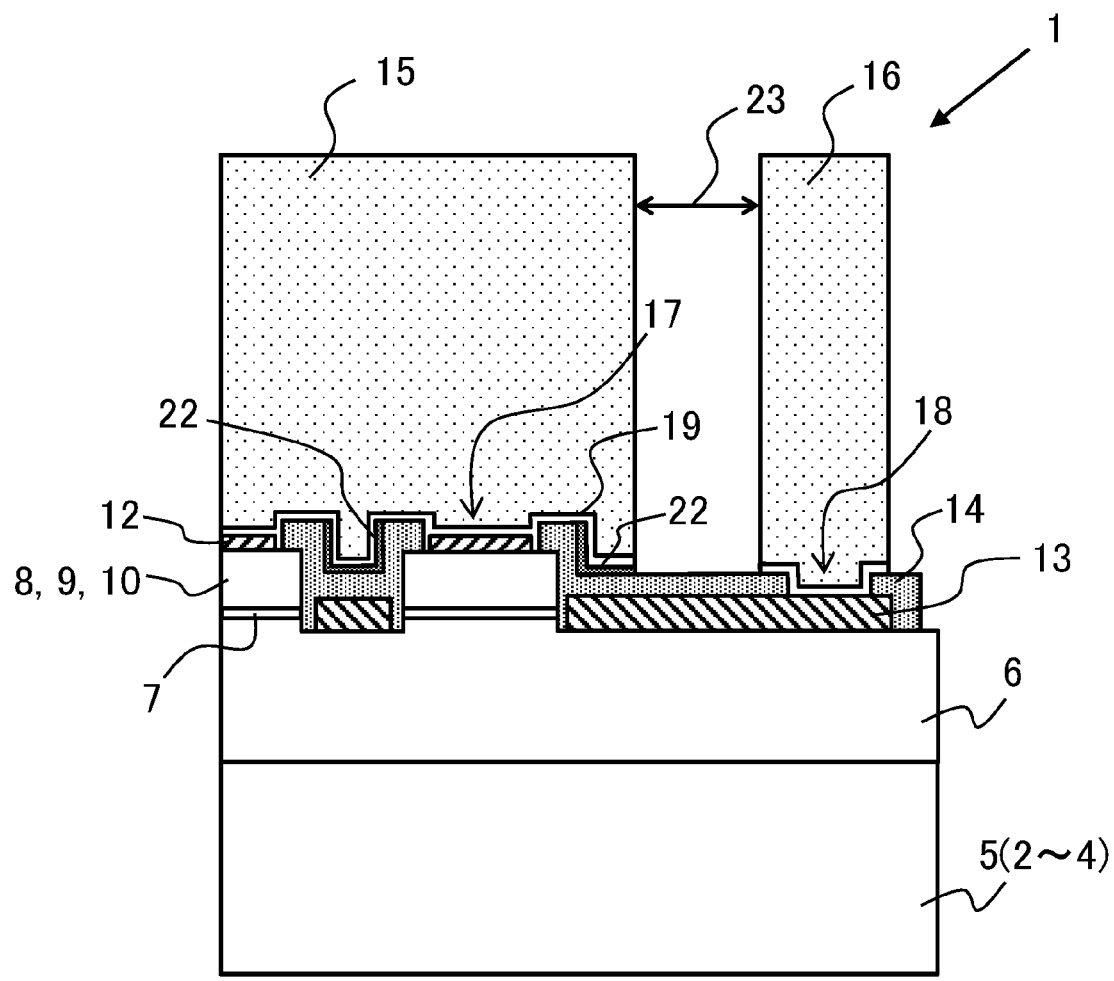
FIG. 11 is a cross-sectional view schematically showing one example of an element structure taken along the line B-B' in the third embodiment of a nitride semiconductor ultraviolet light-emitting element in the present invention.

Hereinafter, the third embodiment of the present light-emitting element 1 will be described as one variation of the first or second embodiment. FIG. 11 schematically shows one example of an element structure in a right side in the Y direction (region of X≥0) in the present light-emitting element 1 of the third embodiment. FIG. 11 is a cross-sectional view of the present light-emitting element 1 parallel to the X-Z plane along the line B-B' in the plan view in FIG. 8. Here, the element structure shown in FIG. 11 is an element structure as one variation of the first embodiment, and plated metal films 20 and 21 described in the second embodiment are not shown.

In the third embodiment, as shown in FIG. 11, the present light-emitting element 1 further includes an ultraviolet light reflective layer 22 which reflects the ultraviolet light emitted from the active layer 7 of the present light-emitting element 1, and formed between the first plated electrode 15 and the protective insulating film 14, specifically between the seed film 19 on the first plated electrode 15 side and the protective insulating film 14. In the present light-emitting element 1 in each of the first to third embodiments, the protective insulating film 14 is the $SiO_2$ film or $Al_2O_3$ film which transmits the ultraviolet light. Ni or Ti/Cu which is the component of the seed film 19 covering the upper surface and the side surface of the mesa reflects the ultraviolet light at an ultraviolet light reflectivity (about 33% in the case of copper, for example) corresponding to a light emission wavelength of the present light-emitting element 1. When an ultraviolet light reflectivity of a component of the ultraviolet light reflective layer 22 is higher than the ultraviolet light reflectivity of the seed film 19, the ultraviolet light emitted from the active layer 7 passes through the protective insulating film 14 and then the ultraviolet light is reflected at an interface between the ultraviolet light reflective layer 22 and the protective insulating film 14 toward the semiconductor laminated portion 11 at the higher reflectivity than the seed film 19. Thus, the reflected ultraviolet light partially passes through the substrate 2 and extracted outside the present light-emitting element 1. Therefore, according to the present light-emitting element 1 in the third embodiment, light emission efficiency is improved.

In this embodiment, as one example, the ultraviolet light reflective layer 22 is composed of a single-layer or multiple-layer film containing any one of aluminum (Al), rhodium (Rh), and iridium (Ir) having a higher ultraviolet light reflectivity than the seed film 19. A thickness of the ultraviolet light reflective layer 22 which is an aluminum single-layer film is about 100 nm.

Hereinafter, a manufacturing procedure of the ultraviolet light reflective layer 22 will be described. The ultraviolet light reflective layer 22 is formed after the first opening 17 and the second opening 18 are formed in the protective insulating film 14 and before the seed film 19 is formed on the whole substrate surface in the first embodiment, in such a manner that a photoresist having a reverse pattern of the ultraviolet light reflective layer 22 is formed on the whole substrate surface, a single-layer or multiple-layer metal film as the ultraviolet light reflective layer 22 is formed by sputtering or electron beam evaporation method. Then the photoresist is removed by a liftoff method to remove the metal film formed on the photoresist. Thus, the ultraviolet light reflective layer 22 is formed as shown in FIG. 11.

After the ultraviolet light reflective layer 22 is formed, the process for forming the seed film 19 and the subsequent processes are performed, as described in the first embodiment, and then the first plated electrode 15 and the second plated electrode 16 are formed. In the third embodiment also, after the first plated electrode 15 and the second plated electrode 16 are formed and polished, the plated metal films 20 and 21 described in the second embodiment may be formed as needed.

Since the third embodiment differs from the first embodiment in that the ultraviolet light reflective layer 22 is formed between the seed film 19 and the protective insulating film 14, a planarly-viewed pattern of the first plated electrode 15 in the present light-emitting element 1 in the third embodiment is the same or almost the same as the planarly-viewed pattern of the first plated electrode 15 in the present light-emitting element 1 in the first embodiment shown in FIG. 9, and a planarly-viewed pattern of the second plated electrode 16 in the present light-emitting element 1 in the third embodiment is the same as the planarly-viewed pattern of the second plated electrode 16 in the present light-emitting element 1 in the first embodiment shown in FIG. 9, so that their drawings are omitted. The ultraviolet light reflective layer 22 which is formed in the side wall portion of the mesa and in the second region R2 does not affect the outer line of the first plated electrode 15 basically.

Here, in the element structure shown in FIG. 11, then electrode 13 exists below the first plated electrode 15 in the second region R2 through the protective insulating film 14. Therefore, in a case where the multiple-layer metal film of the n electrode 13 partially includes an Al layer having a high ultraviolet light reflectivity, the original effect cannot be exerted even in the formation of the ultraviolet light reflective layer 22 on the n electrode 13. Therefore, the ultraviolet light reflective layer 22 is not always required to be provided in a whole region between the seed film 19 on the first plated electrode 15 side and the protective insulating film 14, and there is no need to provide the ultraviolet light reflective layer 22 at least at a portion overlapping with the n electrode 13. However, in a case where the region having the n electrode 13 and the region not having the n electrode 13 are mixed under the first plated electrode 15 in the second region R2 through the protective insulating film 14, the ultraviolet light reflective layer 22 may be provided in the whole region between the seed film 19 on the first plated electrode 15 side and the protective insulating film 14.

Fourth Embodiment

Figure 12:
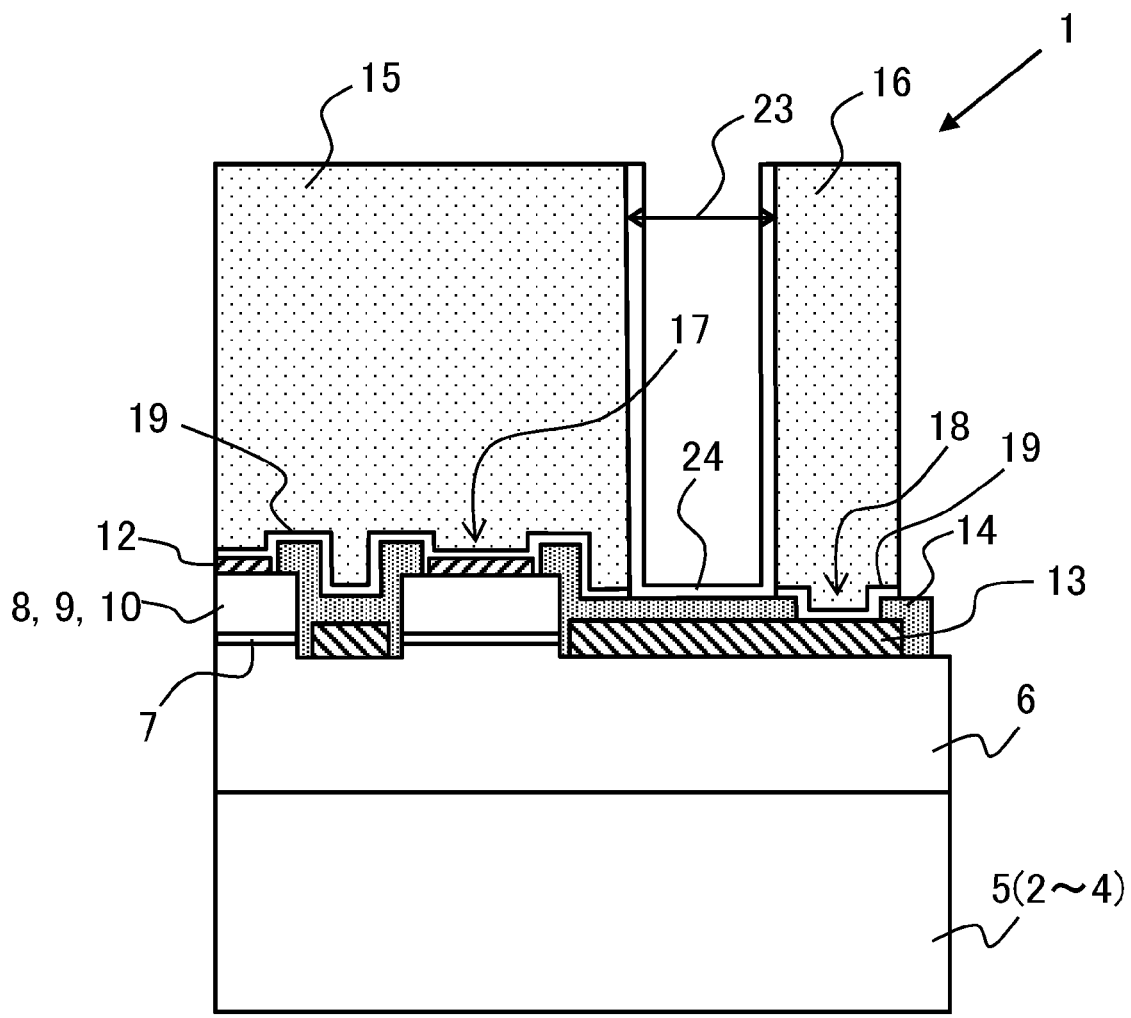
FIG. 12 is a cross-sectional view schematically showing one example of an element structure taken along the line B-B' in the fourth embodiment of a nitride semiconductor ultraviolet light-emitting element in the present invention.

Hereinafter, the fourth embodiment of the present light-emitting element 1 will be described as one variation of the first to third embodiments. FIG. 12 schematically shows one example of an element structure in a right side in the Y direction (region of X≥0) in the present light-emitting element 1 of the fourth embodiment. FIG. 12 is a cross-sectional view of the present light-emitting element 1 parallel to the X-Z plane along the line B-B' in the plan view in FIG. 8. Here, the element structure shown in FIG. 12 is an element structure as one variation of the first embodiment, and plated metal films 20 and 21 described in the second embodiment and the ultraviolet light reflective layer 22 described in the third embodiment are not shown.

In the fourth embodiment, as shown in FIG. 12, the present light-emitting element 1 locally includes an opaque insulating film 24 which does not transmit the ultraviolet light emitted from the active layer 7 of the present light-emitting element 1 and is formed on the protective insulating film 14 which is exposed in a bottom portion of a gap 23 between the first plated electrode 15 and the second plated electrode 16, after the plating sheet film and the seed film 19 are removed.

The present light-emitting element 1 in any one of the first to fourth embodiments includes the protective insulating film 14 composed of the $SiO_2$ film or the $Al_2O_3$ film which transmits the ultraviolet light. Therefore, the ultraviolet light emitted from the active layer 7 of the present light-emitting element 1 is partially not emitted outside from a back surface of the substrate 2 but reflected toward the semiconductor laminated portion 11, passes through the protective insulating film 14 exposed in the bottom portion of the gap 23, and enters the gap 23. Here, depending on a composition of a resin filled in the gap 23, the resin could be deteriorated because the resin is exposed to the ultraviolet light which entered the gap 23. Furthermore, a short circuit could be caused between the first and second plated electrodes 15 and 16 because a solder component such as tin attached to the first and second plated electrodes 15 and 16 is diffused by a photochemical reaction and an electric field applied between the first and second plated electrodes 15 and 16. However, when the opaque insulating film 24 is provided to cover the bottom portion of the gap 23, the resin filled between the first and second plated electrodes 15 and 16 can be prevented from being exposed to the ultraviolet light, and as a result, the above defect such as deterioration and short circuit can be prevented.

In this embodiment, the opaque insulating film 24 is an insulating film composed of GaP, GaN, GaAs, SiC, or SiN and formed by a method in accordance with the material to be used. For example, the opaque insulating film 24 composed of GaP is formed by sputtering, and the opaque insulating film 24 composed of GaN, GaAs, SiC, or SiN is formed by CVD. A thickness of the opaque insulating film 24 is about 300 nm, and a larger thickness is preferable as a light-blocking film.

Hereinafter, a procedure for manufacturing the opaque insulating film 24 will be described. The opaque insulating film 24 is formed by depositing GaP on the whole substrate surface by sputtering as one example after the first and second plated electrodes 15 and 16 are formed, and the plating sheet film and the seed film 19 are removed and before the upper surfaces of the first and second plated electrodes 15 and 16 are polished in the first embodiment. Subsequently, the CMP in the first embodiment is performed. Through this polishing process, the GaP deposited on the upper surfaces of the first and second plated electrodes 15 and 16 is removed first, and then the upper surfaces of the first and second plated electrodes 15 and 16 are polished and planarized, whereby the upper surfaces of the first and second plated electrodes 15 and 16 are leveled with each other. On the other hand, the deposited GaP is left on the bottom surface of the gap 23 between the first and second plated electrodes 15 and 16 without being polished, whereby the opaque insulating film 24 is formed. Furthermore, the GaP attached on the side wall surfaces of the first and second plated electrodes 15 and 16 may be left without being polished. In addition, since the above processes are performed on the wafer, the gap 23 between the first and second plated electrodes 15 and 16 is not only the gap between the first and second plated electrodes 15 and 16 in the same element region, but also a gap between the first plated electrodes 15 in the adjacent element regions, a gap between the second plated electrodes 16 in the adjacent element regions, or a gap between the one plated electrode 15 and the other second plated electrode 16 in the adjacent element regions. Thus, the opaque insulating film 24 is formed on the bottom surface of each of the above gaps 23.

In the fourth embodiment also, the plated metal films 20 and 21 described in the second embodiment may be formed as needed after the first and second plated electrodes 15 and 16 are formed and polished. Furthermore, in the fourth embodiment also, the ultraviolet light reflective layer 22 described in the third embodiment may be formed as needed after the first opening 17 and the second opening 18 are formed in the protective insulating film 14 and before the seed film 19 is formed on the whole substrate surface. Still furthermore, in the fourth embodiment also, the plated metal films 20 and 21 described in the second embodiment and the ultraviolet light reflective layer 22 described in the third embodiment both may be formed.

Here, in the element structure shown in FIG. 12, the n electrode 13 exists under the exposed protective insulating film 14 in the gap 23 between the first and second plated electrodes 15 and 16, so that in a case where the multiple-layer metal film of the n electrode 13 partially includes an Al layer having a high ultraviolet light reflectivity, the ultraviolet light emitted toward the gap 23 is reflected by the Al layer in the n electrode 13, and not enter the gap 23. In this case, the opaque insulating film 24 is not necessarily provided on the bottom portion of the gap 23. However, the outer line of the first plated electrode 15 is not limited to the case where the first plated electrode 15 is located above the n electrode 13 through the protective insulating film 14 as illustrated in FIG. 9, so that it is effective to provide the opaque insulating film 24 in the gap 23 not having the n electrode 13 on its lower side.

Fifth Embodiment

Hereinafter, the fifth embodiment of the present light-emitting element 1 will be described as one variation of the first or second embodiment. In the present light-emitting element 1 in the first or second embodiment, the protective insulating film 14 is a film which transmits the ultraviolet light such as the $SiO_2$ film or $Al_2O_3$ film. However, in the case where the protective insulating film 14 is composed of the material which transmits the ultraviolet light, light emission efficiency can be improved by providing the ultraviolet light reflective layer 22 described in the third embodiment. On the other hand, depending on the composition of the resin filled in the gap 23 between the first plated electrode 15 and the second plated electrode 16, and thus, the defect described in the fourth embodiment could be caused, but the defect can be prevented by providing the opaque insulating film 24.

In the fifth embodiment, the protective insulating film 14 is composed of a material which does not transmit the ultraviolet light like the opaque insulating film 24 described in the fourth embodiment, such as GaP, GaN, GaAs, SiC, or SiN by a known method such as CVD method or sputtering method, instead of being composed of the material which transmits the ultraviolet light. The protective insulating film 14 in this case is formed to have a thickness of 100 nm to 1 μm, or more preferably 150 nm to 350 nm similar to the first embodiment.

In the fifth embodiment, since the protective insulating film 14 is composed of the material which does not transmit the ultraviolet light, the ultraviolet light emitted from the active layer 7 of the present light-emitting element 1 is prevented from entering the gap 23 through the protective insulating film 14. Accordingly, it is not necessary to separately provide the opaque insulating film 24 described in the fourth embodiment, on the bottom portion of the gap 23. Furthermore, in the fifth embodiment, the ultraviolet light reflective layer 22 described in the third embodiment is not required because the ultraviolet light reflective layer 22 exerts no effects. Furthermore, in the fifth embodiment also, the plated metal films 20 and 21 described in the second embodiment may be formed as needed after the first plated electrode 15 and the second plated electrode 16 are formed and polished.

However, depending on the material to be used for the protective insulating film 14 such as SiN, the film could transmit the ultraviolet light when the film is thin, so that the film could be a semi-transmissive film to the ultraviolet light. In this case, similar to the first embodiment, the ultraviolet light reflective layer 22 described in the third embodiment or the opaque insulating film 24 described in the fourth embodiment, or both of them may be employed as needed.

Sixth Embodiment

Figure 13:
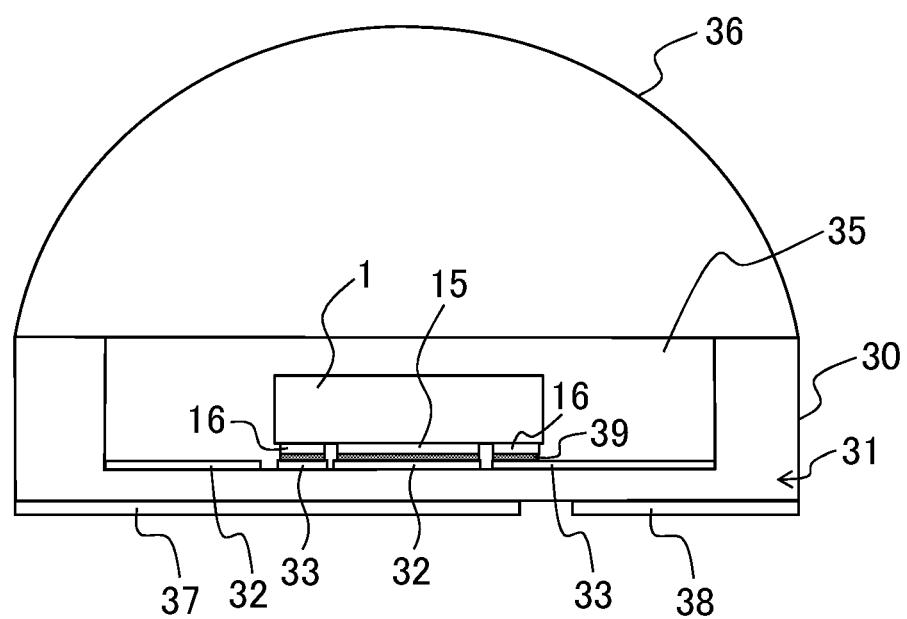
FIG. 13 is a cross-sectional view schematically showing one configuration example of a nitride semiconductor ultraviolet light-emitting device in the present invention.
Figure 13:
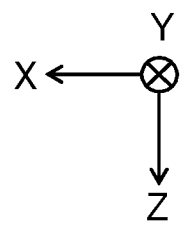

FIG. 13 is a schematic cross-sectional view showing one configuration example of a nitride semiconductor ultraviolet light-emitting device in which the present light-emitting element 1 is mounted on a submount 30 (corresponding to a base) by flip-chip mounting (hereinafter, referred to as the "present light-emitting device" occasionally). In FIG. 13, the present light-emitting element 1 is mounted on the submount 30 upside down, that is, with the upper surfaces of the first and second plated electrodes 15 and 16 facing downward. The present light-emitting element 1 has the element structure which is one of the element structures described in the first to fifth embodiments or a combined element structure of those, and is used as a diced chip. In addition, FIG. 13 shows a cross-sectional structure (parallel to the X-Z plane along the line B-B' in the plan view in FIG. 8) in which the present light-emitting element 1 described in the first embodiment is used as one example. Furthermore, as for the X-Y-Z coordinate axes in FIG. 13 and FIGS. 14A, 14B, and 15 which will be described later, since the device is shown based on the present light-emitting element 1, +Z direction extends downward in these drawings.

Figure 14A:
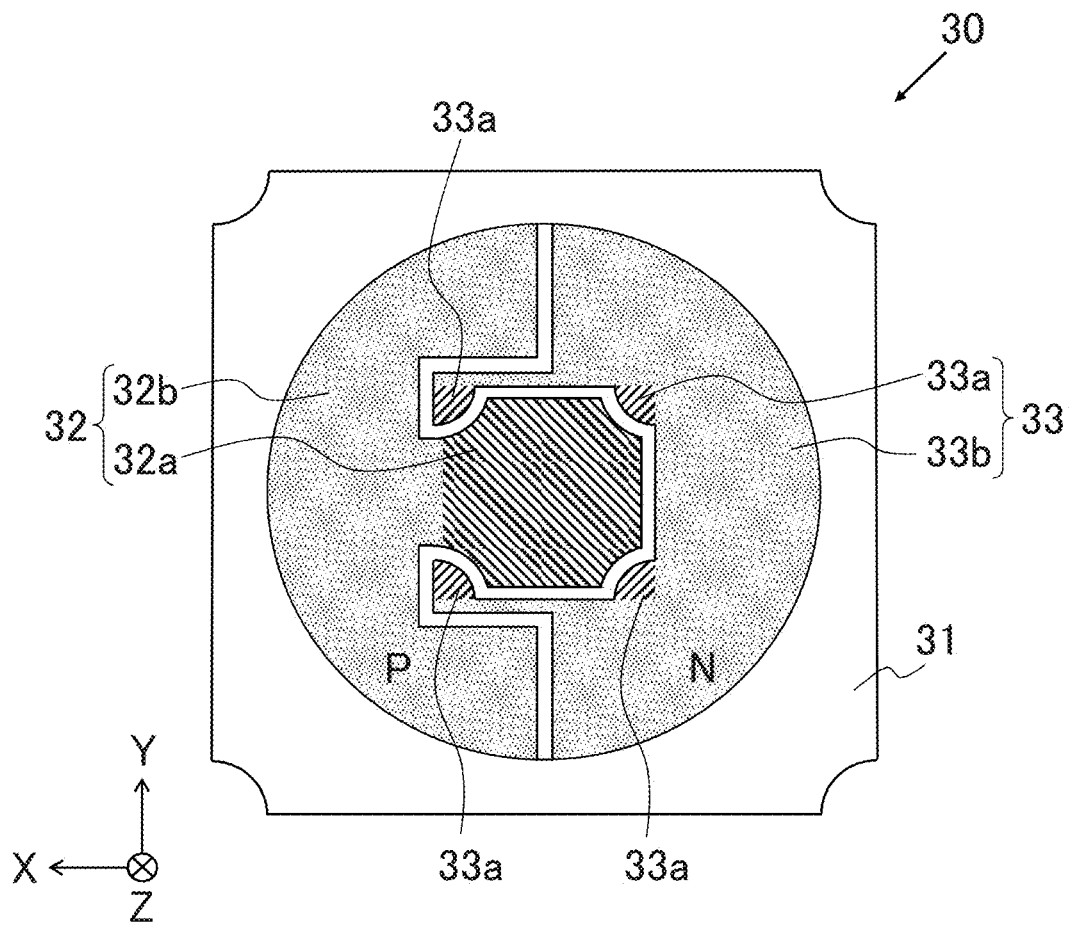
FIGS. 14A and 14B are a plan view and a cross-sectional view schematically showing a planar shape and a cross-sectional shape of a submount to be used in the nitride semiconductor ultraviolet light-emitting device shown in FIG. 13, respectively.
Figure 14B:
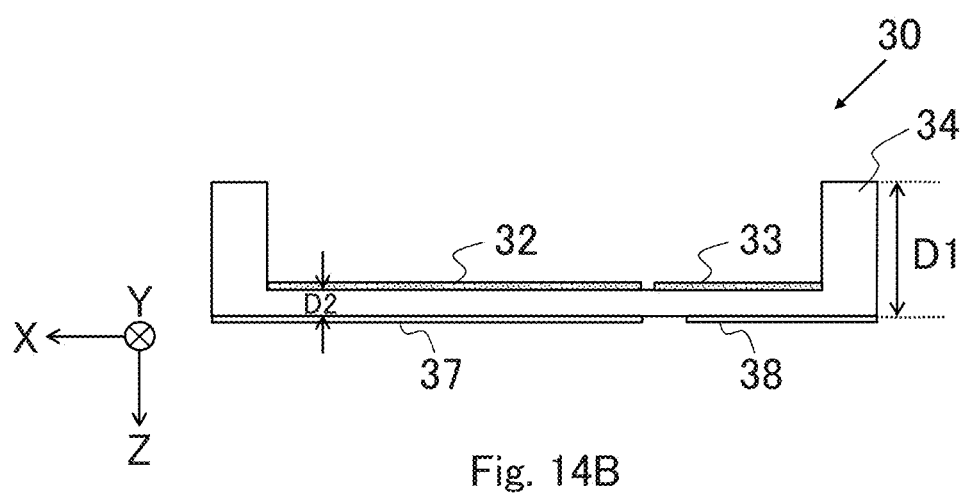

FIG. 14A is a plan view showing a planarly-viewed shape of the submount 30, and FIG. 14B is a cross-sectional view of a cross-sectional shape parallel to the X-Z plane passing through a center of the submount 30 in the plan view in FIG. 14A. The submount 30 is configured such that a first metal electrode wiring 32 on an anode side and a second metal electrode wiring 33 on a cathode side are formed on a part of a surface of a base material 31 composed of an insulating material, and a thickness D1 of a side wall 34 of the base material 31 is larger than a thickness D2 in a center portion provided inside the side wall 34 so that a sealing resin 35 for sealing the present light-emitting element 1 can be filled in a space surrounded by the side wall 34. Furthermore, a semi-spherical condenser lens 36 composed of quartz glass and transmitting the ultraviolet light emitted from the present light-emitting element 1 is fixed on an upper surface of the side wall 34. The sealing resin 35 is covered with the lens 36, and fixed in the space surrounded by the side wall 34. Furthermore, the first and second metal electrode wirings 32 and 33 are connected to lead terminals 37 and 38 provided on a back surface of the base material 31, respectively, through penetration electrodes (not shown) provided in the base material 31. In a case where the submount 30 is mounted on another printed substrate, metal wirings on the printed substrate are electrically connected to the lead terminals 37 and 38. Furthermore, the lead terminals 37 and 38 cover an almost entire surface of the base material 31 and serve as a heat sink. In this embodiment, the base material 31 of the submount 30 is composed of an insulating material such as AlN. Furthermore, the base material 31 is preferably composed of AlN in view of heat releasing property, but the base material 31 may be composed of ceramics such as alumina ($Al_2O_3$). Each of the first and second metal electrode wirings 32 and 33 includes a thick copper-plated film, and a three-layer metal film of Ni/Pd/Au formed thereon by electroless plating, as one example. In the above one example, the first and second metal electrode wirings 32 and 33 are configured similarly to the first and second plated electrodes 15 and 16 and the plated metal films 20 and 21 in the present light-emitting element 1. Furthermore, an ultraviolet light transmittance of the lens 36 is to be suitable for the light emission wavelength of the present light-emitting element 1 to be used. Furthermore, instead of the lens 36 composed of quartz glass, a surface of the sealing resin 35 may be formed into a light-condensing curved surface such as spherical surface. Furthermore, the lens 36 may be a light-diffusing lens for the intended use, other than the condenser lens, or the lens 36 is not always needed.

As shown in FIGS. 14A and 14B, the first and second metal electrode wirings 32 and 33 are formed to be exposed on the surface of a center portion of the base material 31 surrounded by the side wall 34, and the first and second metal electrode wirings 32 and 33 are spaced apart from each other to be electrically separated. The first metal electrode wiring 32 includes a first electrode pad 32a and a first wiring portion 32b connected to the first electrode pad 32a. Furthermore, the second metal electrode wiring 33 includes four second electrode pads 33a and a second wiring portion 33b connected to the second electrode pads 33a. The first electrode pad 32a has a planarly-viewed shape slightly larger than the planarly-viewed shape of the first plated electrode 15 of the present light-emitting element 1, and located in a center of the center portion of the base material 31. Planarly-viewed shapes and positions of the second electrode pads 33a are set such that when the present light-emitting element 1 is disposed with the first plated electrode 15 facing the first electrode pad 32a, four second plated electrodes 16 face four second electrode pads 33a, respectively. In FIG. 14A, hatching is applied to the first electrode pad 32a and the second electrode pads 33a, respectively.

The present light-emitting element 1 is mounted and fixed on the center portion of the base material 31 with the upper surfaces of the first and second plated electrodes 15 and 16 facing downward, and by soldering, the first plated electrode 15 and the four second plated electrodes 16 are electrically and physically connected to the first electrode pad 32a and the four second electrode pads 33a, respectively. In this embodiment, the present light-emitting element 1 is mounted on the submount 30 by flip-chip mounting.

As the sealing resin of the ultraviolet light-emitting element, fluorine-based resin and silicone resin are proposed to be used, but it has been found that the silicone resin deteriorates when the silicone resin is excessively exposed to the ultraviolet light. Especially, as the ultraviolet light-emitting element is increasingly required to achieve a higher output, an energy density of the emitted light tends to increase, and power consumption is accordingly increased to cause a large amount of heat generation. Thus, the sealing resin problematically deteriorates due to the heat generation and the ultraviolet light having the high energy density.

It has been also found that the fluorine-based resin is excellent in heat resistance and high in ultraviolet light resistance, but the general fluorine resin such as polytetrafluoroethylene is opaque. As for the fluorine-based resin, a polymer chain is rectilinear and rigid, and easily crystalized, so that a crystalline portion and an amorphous portion are mixed, and the light scatters at its interface, which makes the resin opaque.

In this embodiment, an amorphous fluorine resin is used as the sealing resin 35 because an amorphous fluorine resin is excellent in heat resistance, ultraviolet light resistance, and ultraviolet light permeability. The amorphous fluorine resin includes an amorphized polymer alloy provided by copolymerizing a fluorine resin of a crystalline polymer, a copolymer of perfluorodioxole (trade name, Teflon AF (registered trademark) manufactured by Du Pont Kabushiki Kaisha), and a cyclized polymer of perfluoro butenyl vinyl ether (trade name, Cytop (registered trademark) manufactured by Asahi Glass Co., Ltd). The fluorine resin of the latter cyclized polymer is likely to become amorphous because its main chain has a cyclic structure, so that transparency is high. The amorphous fluorine resin is roughly divided into two kinds, that is, a bonding fluorine resin having a reactive functional group which can be bonded to metal, and a non-bonding fluorine resin having a non-reactive functional group which is not bonded to metal.

In the case where the present light-emitting element 1 described in one of the first to fifth embodiments is mounted on the submount 30, there is a gap between the base material 31 of the submount 30 and the present light-emitting element 1. Therefore, when the present light-emitting element 1 described in one of the first to fifth embodiments is sealed with the sealing resin 35 of the amorphous fluorine resin, the sealing resin 35 is naturally introduced in this gap. As described above, when the bonding amorphous fluorine resin is irradiated with the high-energy ultraviolet light during light emitting operation by the ultraviolet light-emitting element, there is a possibility that due to a photochemical reaction of the amorphous fluorine resin, and the electric field applied between the electrodes, a metal atom of the pad electrode and a metal atom in the solder material are separated and migrated, which causes a short circuit between the electrodes of the ultraviolet light-emitting element. Thus, in order to prevent the short circuit from occurring, the above-described non-bonding amorphous fluorine resin is preferably used as the sealing resin 35.

The above non-bonding amorphous fluorine resin is an amorphous fluorine resin composed of a polymer or copolymer having a non-reactive terminal functional group. Specifically, the non-bonding amorphous fluorine resin has a fluorine-containing aliphatic ring structure as a structure unit composing the polymer or the copolymer, and the above terminal function group is a perfluoroalkyl group such as $CF_3$. That is, the non-bonding amorphous fluorine resin does not have a reactive terminal functional group which is bonded to metal.

Figure 15:
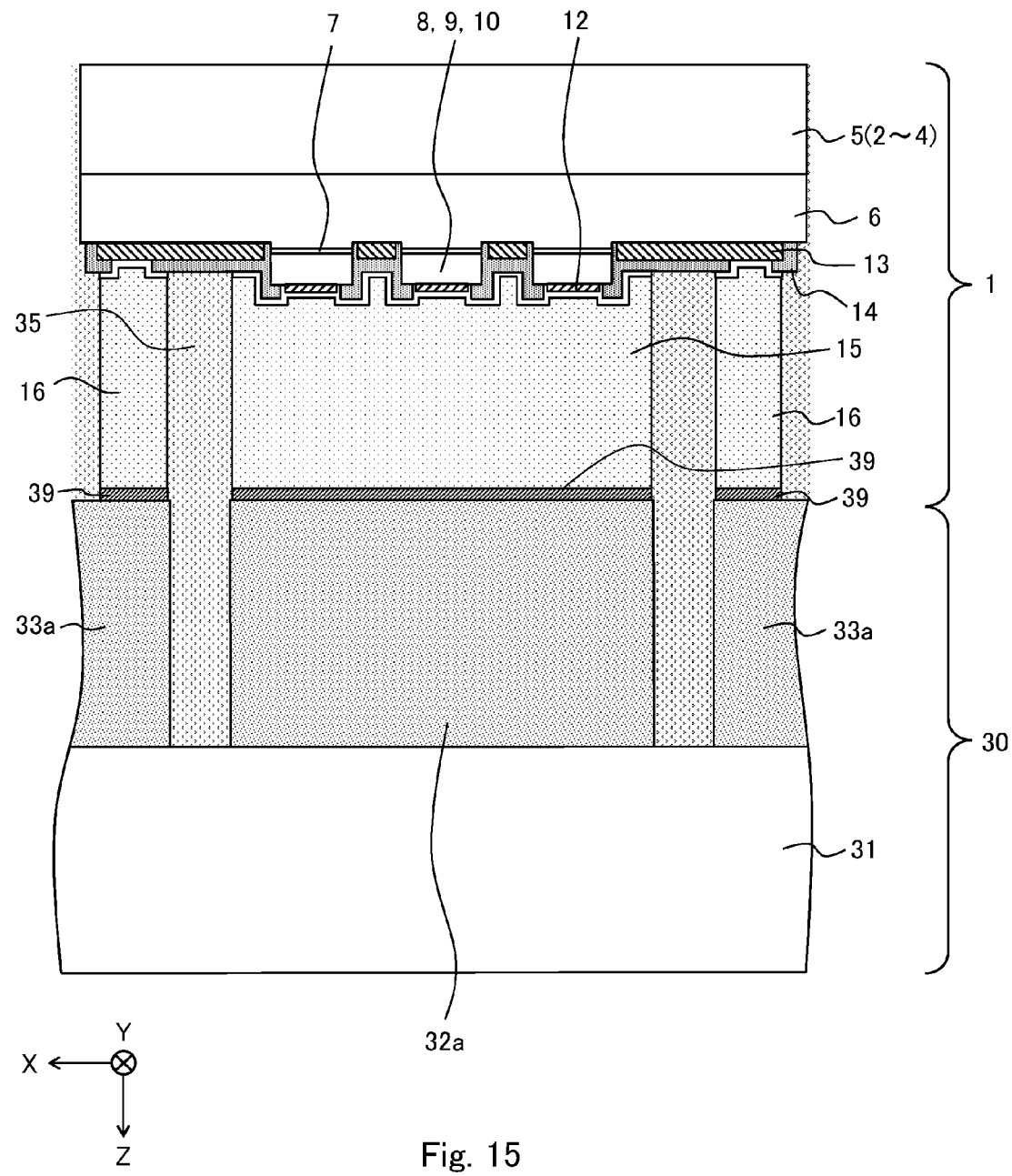
FIG. 15 is a cross-sectional view schematically showing a structure of an essential part of the nitride semiconductor ultraviolet light-emitting device shown in FIG. 13.
Figure 16:
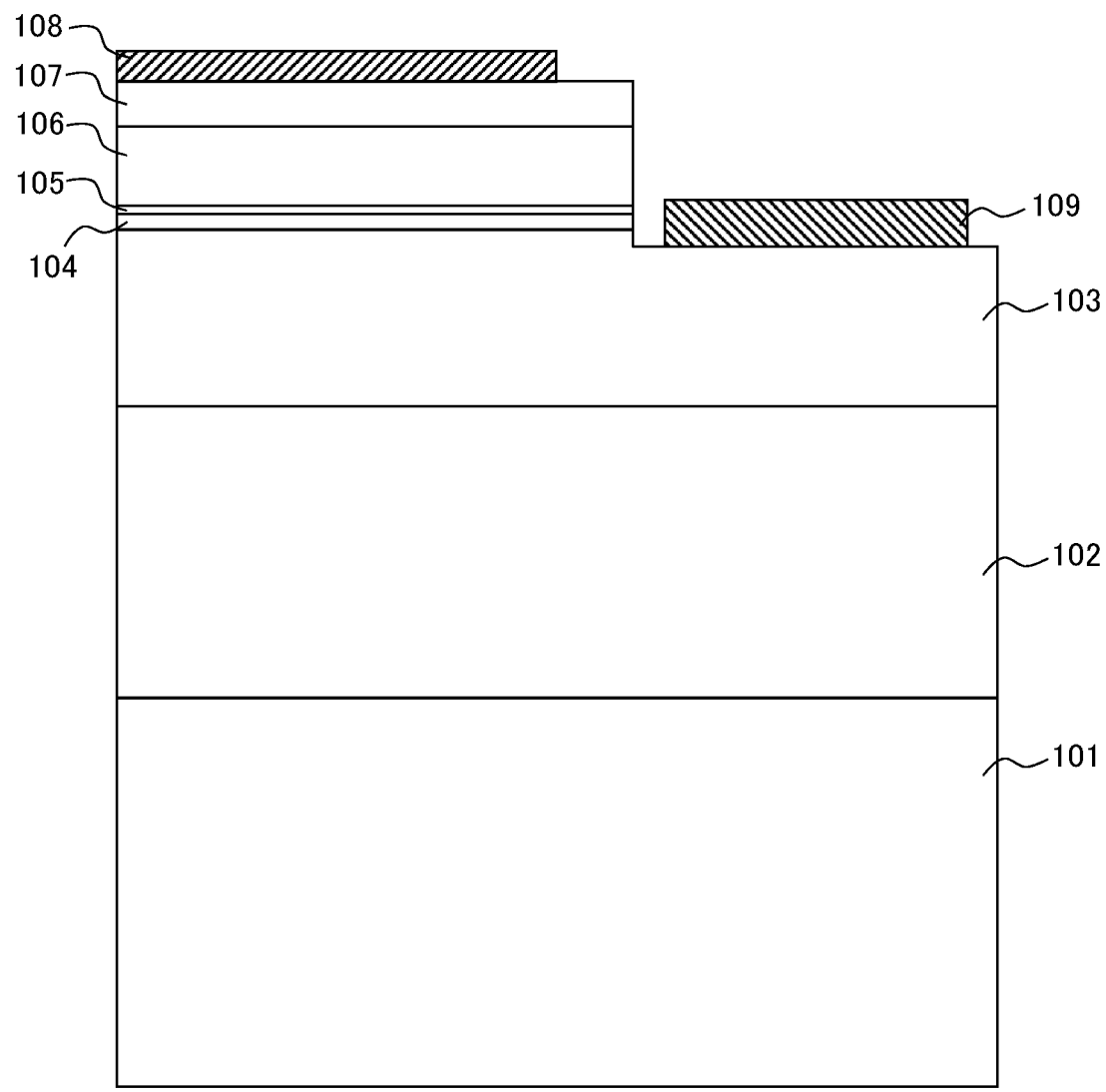
FIG. 16 is a cross-sectional view schematically showing a conventional crystal layer structure of an AlGaN-based light-emitting diode.

Hereinafter, a method for manufacturing the present light-emitting device will be briefly described with reference to FIG. 15. FIG. 15 is an essential-part cross-sectional view schematically showing a portion in which the first and second plated electrodes 15 and 16 are connected to the first and second metal electrode wirings 32 and 33, respectively with a solder 39 in the present light-emitting device shown in FIG. 13 (cross-sectional part parallel to the X-Z plane along the ling B-B' in the plan view in FIG. 8).

First, a bare chip of the diced present light-emitting element 1 is fixed on the first and second metal electrode wirings 32 and 33 of the submount 30 by the known flip-chip mounting. Specifically, the first plated electrode 15 is physically and electrically connected to the first metal electrode wiring 32 through the solder 39, and the second plated electrode 16 is physically and electrically connected to the second metal electrode wiring 33 through the solder 39 (step 1). Thus, the p electrode 12 of the present light-emitting element 1 is electrically connected to the first metal electrode wiring 32, and the n electrode 13 of the present light-emitting element 1 is electrically connected to the second metal electrode wiring 33. The soldering process can be performed by a known soldering method such as reflow soldering, so that a detailed description is omitted.

Subsequently, a coating liquid is prepared by dissolving the non-bonding amorphous fluorine resin in a fluorine-containing solvent, preferably an aprotic fluorine-containing solvent and injected into the space surrounded by the side wall 34 of the submount 30 with a highly-strippable Teflon needle, and the solvent is volatilized while the coating liquid is gradually heated. Thus, a first resin film of the non-bonding amorphous fluorine resin is formed in each of an inner wall surface of the side wall 34 of the submount 30, the upper surfaces of the first and second metal electrode wirings 32 and 33, the exposed surface of the base material 31 between the first and second metal electrode wirings 32 and 33, the upper surface and side surface of the present light-emitting element 1, and the gap between the present light-emitting element 1 and the upper surface of the submount 30 (step 2). In addition, regarding the volatilization of the solvent in step 2, in order not to leave any air bubbles in the first resin film, the solvent is to be heated and volatilized by gradually increasing the temperature from a low temperature range (such as around room temperature) lower than a boiling point of the solvent to a high temperature range (such as around 200° C.) higher than the boiling point of the solvent.

Next, a solid non-bonding amorphous fluorine resin is put into an inside and an upper space of the first resin film formed in the space surrounded by the side wall 34 of the submount 30 in step 2, melted at 250° C. to 300° C., for example, and then gradually cooled down, and thus a second resin film is formed (step 3).

Finally, the lens 36 is fixed to the upper surface of the side wall 34 (step 4), and thus the present light-emitting device shown in FIG. 13 is manufactured. According to the above manufacturing method, the sealing resin 35 is composed of the first and second resin films. As disclosed in Patent Document 1, the lens 36 is fixed to the upper surface of the side wall 34 with a bonding agent, or fixed to the upper surface of the side wall 34 by an engagement structure provided in the lens 36 and the side wall 34. The method for forming the sealing resin 35 and the method for fixing the lens 36 are not limited to the method described above. Furthermore, the lens 36 is not always required to be provided.

In the present light-emitting device, a soldering area between the first plated electrode 15 and the first metal electrode wiring 32 can be considerably larger than a connection area in a conventional connection configuration in which the comb-shaped p electrode 12 of the present light-emitting element 1 is connected to the first metal electrode wiring 32 through a plurality of small bumps without providing the first plated electrode 15. As a result, the waste heat generated in the light emitting operation of the present light-emitting element 1 can be efficiently transmitted toward the lead terminal 37 through the first plated electrode 15 and the first metal electrode wiring 32, so that the heat releasing efficiency is considerably improved.

Other Embodiments

Hereinafter, variations of the first to sixth embodiments will be described.

<1> According to the first to fifth embodiments, the one first region is surrounded by the second region in the planarly-viewed shape of the present light-emitting element 1, but the first region may be divided into a plurality of sub-regions, and each of the sub-regions may be surrounded by the second region. That is, a plurality of mesas may exist in one element region, and the first plated electrode 15 may be formed with respect to each of the mesas, or the one first plated electrode 15 may be formed to cover the plurality of mesas.

<2> According to the first to fifth embodiments, in the plating process in the manufacturing processes of the present light-emitting element 1, the polishing process is performed to planarize the uneven upper surfaces of the first and second plated electrodes 15 and 16, and level the upper surfaces thereof with each other. However, the polishing process may not be performed in a case where the soldering can be properly performed when the present light-emitting element 1 is mounted by the flip-chip mounting, regardless of the unevenness and the difference in height of the unpolished upper surfaces of the first and second plated electrodes 15 and 16.

<3> According to the fourth embodiment, the opaque insulating film 24 is formed on the bottom portion of the gap 23 between the first and second plated electrodes 15 and 16 by the method in which the opaque insulating film 24 is deposited on the whole substrate surface, and then the opaque insulating film 24 deposited on the upper surfaces of the first and second plated electrodes 15 and 16 are partially removed in the polishing process for the upper surfaces of the first and second plated electrodes 15 and 16. In this case, an etching process for patterning the opaque insulating film 24 is not required, and an etching mask is also not required, so that the process can be simplified.

However, in a case where patterning is performed for the opaque insulating film 24 as needed before or after the polishing process for the first and second plated electrodes 15 and 16, photolithography and etching may be used.

<4> According to the present light-emitting element 1, the first plated electrode 15 is formed in the pre-plating element structure in which the protective insulating film 14 and the first and second plated electrodes 15 and 16 are not formed yet, and completely covers the semiconductor laminated portion 11 (mesa) and the p electrode 12 formed on the semiconductor laminated portion 11 in the first region R1, so that its area of the upper surface is larger than the p electrode 12. As a result, the waste heat generated in the mesa due to the light emitting operation of the present light-emitting element 1 can be efficiently released. Thus, in the above first to fifth embodiments, the present light-emitting element 1 has both of the first and second plated electrodes 15 and 16, but the above effect of efficiently releasing the waste heat to the outside can be almost similarly provided even when the second plated electrode 16 is not provided.

However, in a case where the first plated electrode 15 is only provided without providing the second plated electrode 16, when the first plated electrode 15 and the n electrode 13 are connected to the first and second electrode pads 32a and 33a on the base of the submount 30, respectively with a gold bump similar to the conventional flip-chip mounting, the thickness of the first plated electrode 15 needs to be considerably small to reduce a difference in height between the upper surface of the first plated electrode 15 and the upper surface of the n electrode 13, compared with the case where both of the first and second plated electrodes 15 and 16 are provided.

<5> According to the sixth embodiment, the description has been given to the present light-emitting device in which the one present light-emitting element 1 is mounted on the submount 30, but a plurality of the present light-emitting elements 1 may be mounted on the submount or the base such as the printed substrate, in the present light-emitting device. In this case, the plurality of the present light-emitting elements 1 may be collectively sealed or may be individually sealed with the sealing resin 35. In this case, a resin dam is formed on the surface of the base to surround the one or more present light-emitting elements 1 to be sealed, and the sealing resin 35 is formed in the region surrounded by the resin dam in the manner described in the sixth embodiment, The present light-emitting element 1 can be directly mounted on a printed substrate with a solder because the upper surfaces of the first and second plated electrodes 15 and 16 can be planarized and leveled with each other, similarly to another surface mount type electronic device or an electric element (resistive element, capacitor, diode, or transistor). Therefore, the plurality of the present light-emitting elements 1 may be mounted on the one base, and mounted on the same base together with another surface mount type electronic device or electric element. Furthermore, the base to be used for the present light-emitting element 1 is not limited to the submount and the printed substrate.

<6> According to the present light-emitting element 1, the first plated electrode 15 is formed in the pre-plating element structure in which the protective insulating film 14 and the first and second plated electrodes 15 and 16 are not formed yet, and completely covers the semiconductor laminated portion 11 (mesa) and the p electrode 12 formed on the semiconductor laminated portion 11 in the first region R1, so that its area of the upper surface is larger than the p electrode 12. As a result, the waste heat generated in the mesa due to the light emitting operation of the present light-emitting element 1 can be efficiently released.

Therefore, the pre-plating element structure of the present light-emitting element 1 is not limited to the pre-plating element structure having the laminated structure, the material, the thickness, and the AlN mole fraction shown in FIGS. 1 and 2 and described in the first embodiment, and the pre-plating element structure can be variously changed. For example, the template 5 is shown in FIG. 1 as one example, but the template 5 may not be limited to the one shown in FIG. 1. For example, an ELO-AlN layer may be formed by growing the AlN layer 3 by epitaxial lateral-direction growth method, the AlGaN layer 4 may be omitted, or another substrate may be used instead of the sapphire substrate 2. Furthermore, the thickness and the AlN mole fraction of the AlGaN layer or the GaN layer in the present light-emitting element 1 described in the above embodiment is only one example, and they can be appropriately changed based on a specification of the element. Furthermore, according to the above embodiment, the electron block layer 8 is provided, but the electron block layer 8 is not necessarily provided.

However, it is to be noted that the pre-plating element structure of the present light-emitting element 1 assumes the case where the center emission wavelength is 355 nm or less, so that the structure needs to include the semiconductor laminated portion having, in a laminated manner, the first semiconductor layer composed of the one or more n-type AlGaN-based semiconductor layers, the active layer composed of the one or more AlGaN-based semiconductor layers having the AlN mole fraction of zero or more, and the second semiconductor layer composed of the one or more p-type AlGaN-based semiconductor layers, the n electrode composed of the one or more metal layers, and the p electrode composed of the one or more metal layers. Furthermore, it is preferable that the first region R1 has the recess surrounding the second region R2 from the three directions, in the planarly-viewed shape, the second region R2 includes the recessed region R3 surrounded by the recess of the first region R1 and the periphery region R4 other than the recessed region R3, the n electrode 13 is formed on the first semiconductor layer in the second region R2 and covers the recessed region R3 and the periphery region R4, and the p electrode 12 is formed on the uppermost layer of the second semiconductor layer.

INDUSTRIAL APPLICABILITY

The nitride semiconductor ultraviolet light-emitting element according to the present invention is applicable for a light-emitting diode having a center emission wavelength of about 355 nm or less, and is effective in improving heat release efficiency.

DESCRIPTION OF SYMBOLS

1 Nitride semiconductor ultraviolet light-emitting element
2 Sapphire substrate
3 AlN layer
4 AlGaN layer
5 Template
6 n-type clad layer (n-type AlGaN)
7 Active layer
7a Barrier layer
7b Well layer
8 Electron block layer (p-type AlGaN)
9 p-type clad layer (p-type AlGaN)
10 p contact layer (p-type GaN)
11 Semiconductor laminated portion
12 p electrode
13 n electrode
14 Protective insulating film
15 First plated electrode
16 Second plated electrode
17 First opening
18 Second opening
19 Seed film
20, 21 Plated metal film
22 Ultraviolet light reflective layer
23 Gap between first plated electrode and second plated electrode
24 Opaque insulating film
30 Submount
31 Base material
32 First metal electrode wiring
32a First electrode pad
32b First wiring portion
33 Second metal electrode wiring
33a Second electrode pad
34 Side wall
35 Sealing resin
36 Lens
37, 38 Lead terminal
101 Sapphire substrate
102 Base layer (AlN)
103 n-type clad layer (n-type AlGaN)
104 Multiple quantum well active layer
105 Electron block layer (p-type AlGaN)
106 p-type clad layer (p-type AlGaN)
107 p contact layer (p-type GaN)
108 p electrode
109 n electrode
BL Boundary line between first region and second region
C Boundary between recessed region and peripheral region
R1 First region
R2 Second region
R3 Recessed region
R4 Periphery region

The invention claimed is:

1. A nitride semiconductor ultraviolet light-emitting element comprising:
a semiconductor laminated portion including, in a laminated manner, a first semiconductor layer having one or more n-type AlGaN-based semiconductor layers, an active layer having one or more AlGaN-based semiconductor layers having an AlN mole fraction of zero or more, and a second semiconductor layer having one or more p-type AlGaN-based semiconductor layers;
an n electrode including one or more metal layers;
a p electrode including one or more metal layers;
a protective insulating film; and
a first plated electrode which is in contact with an exposed surface of the p electrode which is not covered with the protective insulating film, wherein
referring to a region that the one nitride semiconductor ultraviolet light-emitting element is formed in a plane parallel to a surface of the semiconductor laminated portion as an element region, the semiconductor laminated portion includes the active layer and the second semiconductor layer laminated on the first semiconductor layer in a first region which is a part of the element region, and does not include the active layer and the second semiconductor layer laminated on the first semiconductor layer in a second region in the element region other than the first region, the first region has a recess surrounding the second region from three directions in planarly-viewed shape, the second region continuously has a recessed region surrounded by the recess of the first region, and a periphery region other than the recessed region, the n electrode is formed on the first semiconductor layer in the second region and covers the recessed region and the periphery region, the p electrode is formed on an uppermost surface of the second semiconductor layer, the protective insulating film covers at least a whole outer side surface of the semiconductor laminated portion in the first region, an upper surface of the first semiconductor layer provided between the first region and the n electrode, and an upper surface and a side surface of an outer edge portion of the n electrode including a portion at least facing the first region, and does not cover and exposes at least one part of a surface of the n electrode and at least one part of a surface of the p electrode, and the first plated electrode is composed of copper or alloy containing copper as a main component, formed by wet plating method, spaced apart from the exposed surface of the n electrode which is not covered with the protective insulating film, and covers a whole upper surface of the first region including the exposed surface of the p electrode, the whole outer side surface of the first region covered with the protective insulating film, and a boundary region which is a part in the second region and is in contact with the first region.

2. The nitride semiconductor ultraviolet light-emitting element according to claim 1, wherein the recessed region of the second region is entirely covered with the first plated electrode through the protective insulating film.

3. The nitride semiconductor ultraviolet light-emitting element according to claim 1, wherein the first plated electrode is spaced apart from the exposed surface of the n electrode which is not covered with the protective insulating film, by 75 μm or more.

4. The nitride semiconductor ultraviolet light-emitting element according to claim 1, wherein the protective insulating film further covers an upper surface and a side surface around an outer edge portion of the p electrode, and an exposed surface of the uppermost surface of the second semiconductor layer which is not covered with the p electrode.

5. The nitride semiconductor ultraviolet light-emitting element according to claim 1, further comprising a second plated electrode formed at least on the exposed surface of the n electrode which is not covered with the protective insulating film, formed by the wet plating method and composed of copper or alloy containing copper as a main component, wherein the first plated electrode and the second plated electrode are spaced apart from each other.

6. The nitride semiconductor ultraviolet light-emitting element according to claim 5, wherein surfaces of the first plated electrode and the second plated electrode are planarized, and heights of the surfaces vertical to the surface of the semiconductor laminated portion are level with each other.

7. The nitride semiconductor ultraviolet light-emitting element according to claim 5, wherein a spaced distance between the first plated electrode and the second plated electrode is 75 μm or more.

8. The nitride semiconductor ultraviolet light-emitting element according to claim 5, wherein a single-layer or multiple-layer plated metal film including gold at least on an uppermost layer is formed on each of the surfaces of the first plated electrode and the second plated electrode.

9. The nitride semiconductor ultraviolet light-emitting element according to claim 1, wherein an outer periphery of the first plated electrode is entirely located on the n electrode through the protective insulating film.

10. The nitride semiconductor ultraviolet light-emitting element according to claim 1, wherein the first plated electrode is formed and filled in a dent in the recessed region surrounded by the outer side surface of the semiconductor laminated portion in the first region, and an upper surface of the first plated electrode is wholly flat.

11. The nitride semiconductor ultraviolet light-emitting element according to claim 1, wherein the wet plating method includes an electrolytic plating method, and a power-feeding seed film used in the electrolytic plating method is formed between the protective insulating film and the first plated electrode.

12. The nitride semiconductor ultraviolet light-emitting element according to claim 11, wherein the protective insulating film includes a transparent insulating film composed of an insulating material which transmits ultraviolet light emitted from the active layer, and an ultraviolet light refractive layer is formed between the protective insulating film and the seed film to reflect the ultraviolet light at a reflectivity higher than an ultraviolet light reflectivity of the seed film.

13. The nitride semiconductor ultraviolet light-emitting element according to claim 1, wherein the protective insulating film includes a transparent insulating film composed of an insulating material which transmits ultraviolet light emitted from the active layer, and an opaque insulating film is formed at least one part on the protective insulating film between the first plated electrode and the exposed surface of the n electrode, and composed of an insulating material which does not transmit the ultraviolet light emitted from the active layer.

14. The nitride semiconductor ultraviolet light-emitting element according to claim 1, wherein the protective insulating film includes an opaque insulating film composed of an insulating material which does not transmit the ultraviolet light emitted from the active layer.

15. A nitride semiconductor ultraviolet light-emitting device comprising:

a base including a metal film on a surface of an insulating base material, the metal film having a predetermined planarly-viewed shape and including two or more electrode pads; and the nitride semiconductor ultraviolet light-emitting element according to claim 1 mounted on the base with the first plated electrode facing the electrode pad, wherein the first plated electrode is electrically and physically connected to the opposed electrode pad.

16. The nitride semiconductor ultraviolet light-emitting device according to claim 15, wherein
- the nitride semiconductor ultraviolet light-emitting element further includes a second plated electrode formed at least on an exposed surface of the n electrode which is not covered with the protective insulating film, formed by the wet plating method, and composed of copper or alloy containing copper as a main component,
- the first plated electrode and the second plated electrode are spaced apart from each other, and
- the first plated electrode is electrically and physically connected to the one electrode pad, and the second plated electrode is electrically and physically connected to the other electrode pad, in the one nitride semiconductor ultraviolet light-emitting element.

17. The nitride semiconductor ultraviolet light-emitting device according to claim 16, wherein
- the base includes a plurality of couples of electrode pads which each include a first electrode pad and at least one second electrode pad electrically separated from the first electrode pad,
- a plurality of the nitride semiconductor ultraviolet light-emitting elements are mounted on the base, and
- the first plated electrode in the one nitride semiconductor ultraviolet light-emitting element is electrically and physically connected to the first electrode pad in the one couple of electrode pads, and the second plated electrode in the one nitride semiconductor ultraviolet light-emitting element is electrically and physically connected to the second electrode pad in the one couple of electrode pads.

* * * * *